United States Patent
Ebuchi et al.

(10) Patent No.: US 7,321,183 B2
(45) Date of Patent: Jan. 22, 2008

(54) FILM BULK ACOUSTIC RESONATOR AND METHOD FOR MANUFACTURING THE SAME

(75) Inventors: Yasuo Ebuchi, Kanagawa (JP); Takako Motai, Kanagawa (JP); Kenya Sano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 514 days.

(21) Appl. No.: 10/890,989

(22) Filed: Jul. 15, 2004

(65) Prior Publication Data
US 2005/0142888 A1 Jun. 30, 2005

(30) Foreign Application Priority Data
Dec. 25, 2003 (JP) ............................ 2003-431235

(51) Int. Cl.
H01L 41/053 (2006.01)
H01L 41/083 (2006.01)

(52) U.S. Cl. .................... 310/324; 310/327; 310/348

(58) Field of Classification Search ................ 310/324, 310/327, 334–335, 348
See application file for complete search history.

(56) References Cited

U.S. PATENT DOCUMENTS 6,060,818 A  5/2000 Ruby et al.
6,355,498 B1  3/2002 Chan et al.
2005/0142888 A1  6/2005 Ebuchi et al.
2006/0176126 A1*  8/2006 Wang et al. ................. 333/187

FOREIGN PATENT DOCUMENTS

JP  9-130199  5/1997
JP  11-284481  10/1999

OTHER PUBLICATIONS

U.S. Appl. No. 10/890,989, filed Jul. 15, 2004, Ebuchi et al.
U.S. Appl. No. 11/043,257, filed Jan. 27, 2005, Sano et al.
U.S. Appl. No. 10/581,030, filed May 30, 2006, Ohara at al.

* cited by examiner

Primary Examiner—Darren Schuberg
Assistant Examiner—Derek Rosenau
(74) Attorney, Agent, or Firm—Oblon, Spivak, McClelland, Maier & Neustadt, P.C.

(57) ABSTRACT

A film bulk acoustic resonator, includes first to fourth insulator patterns disposed apart from each other. The third and fourth insulator patterns are disposed opposite the second and first insulator patterns in relation to the first and second insulating patterns, respectively. A bottom conductive layer is disposed above the first and third insulator patterns spreading from a region between the first and second insulator patterns to the third insulator pattern. A piezoelectric film is provided on the bottom conductive layer, disposed above the region between the first and second insulating patterns. A top conductive layer is facing the bottom conductive layer so as to sandwich the piezoelectric film, spreading from the region between the first and second insulator patterns to the fourth insulator pattern.

10 Claims, 20 Drawing Sheets

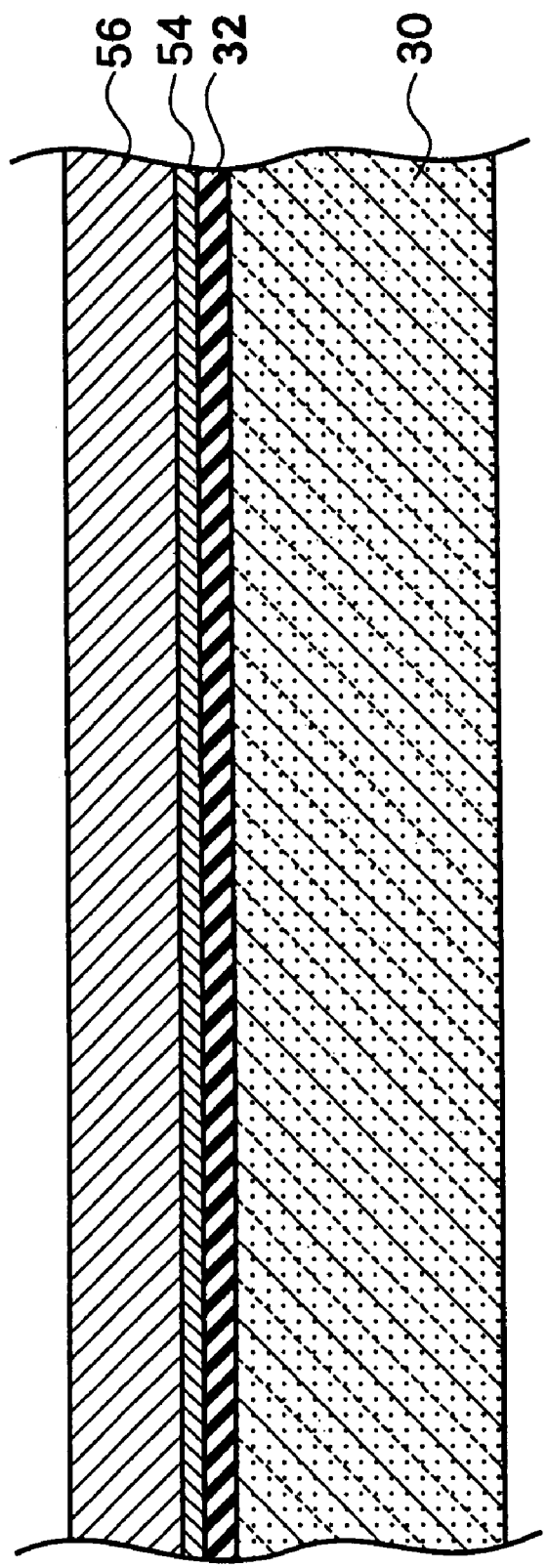

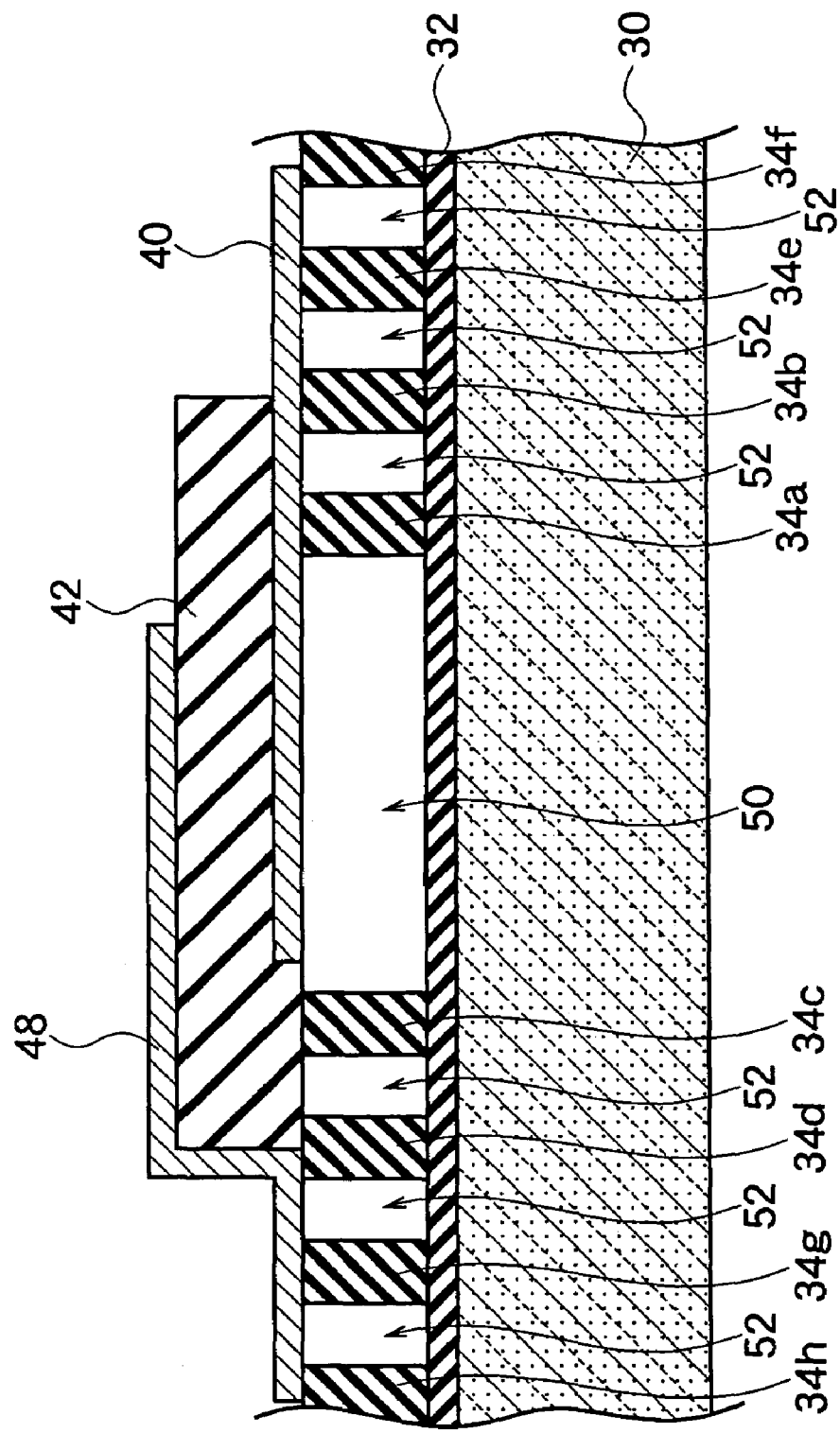

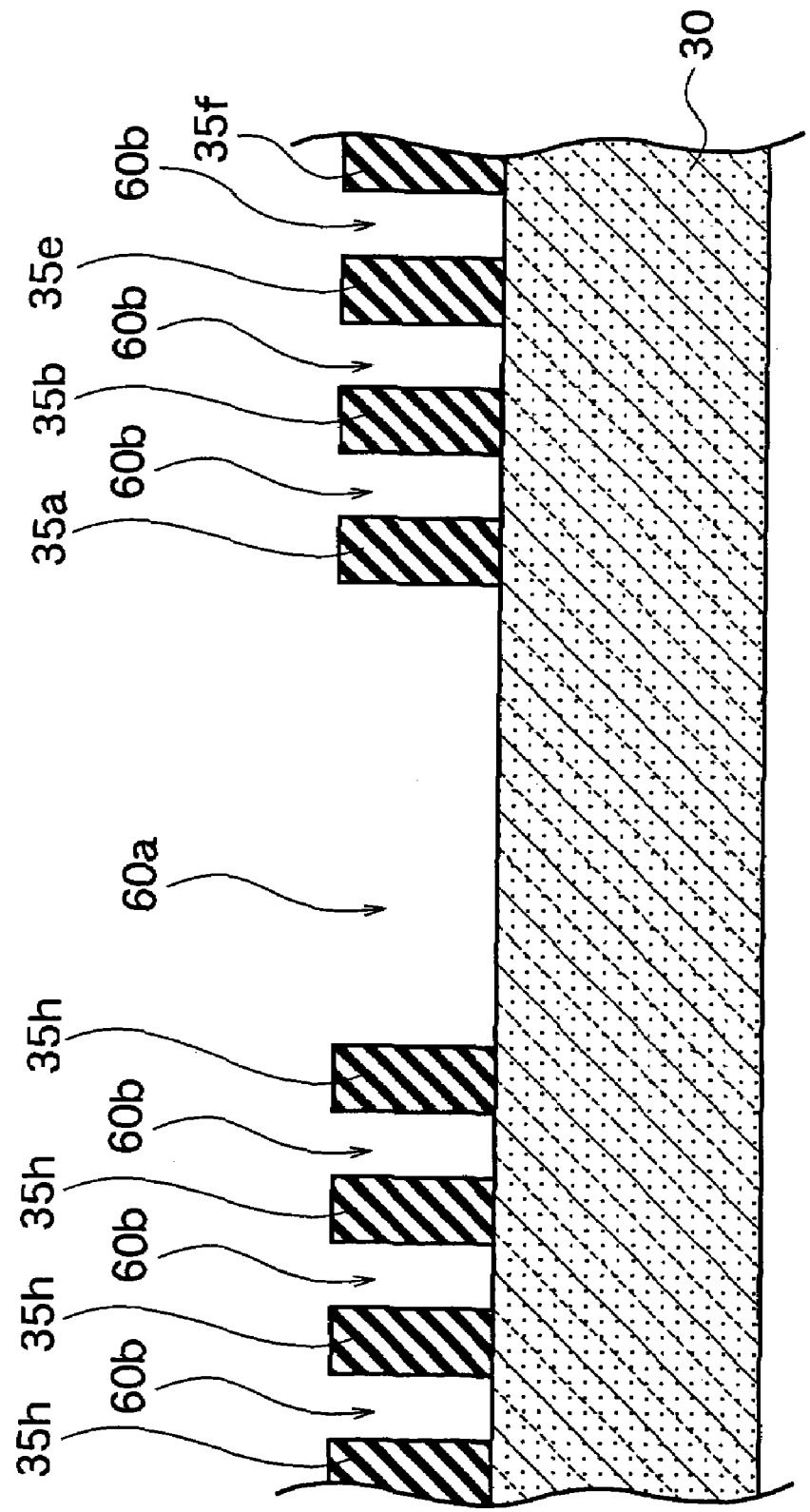

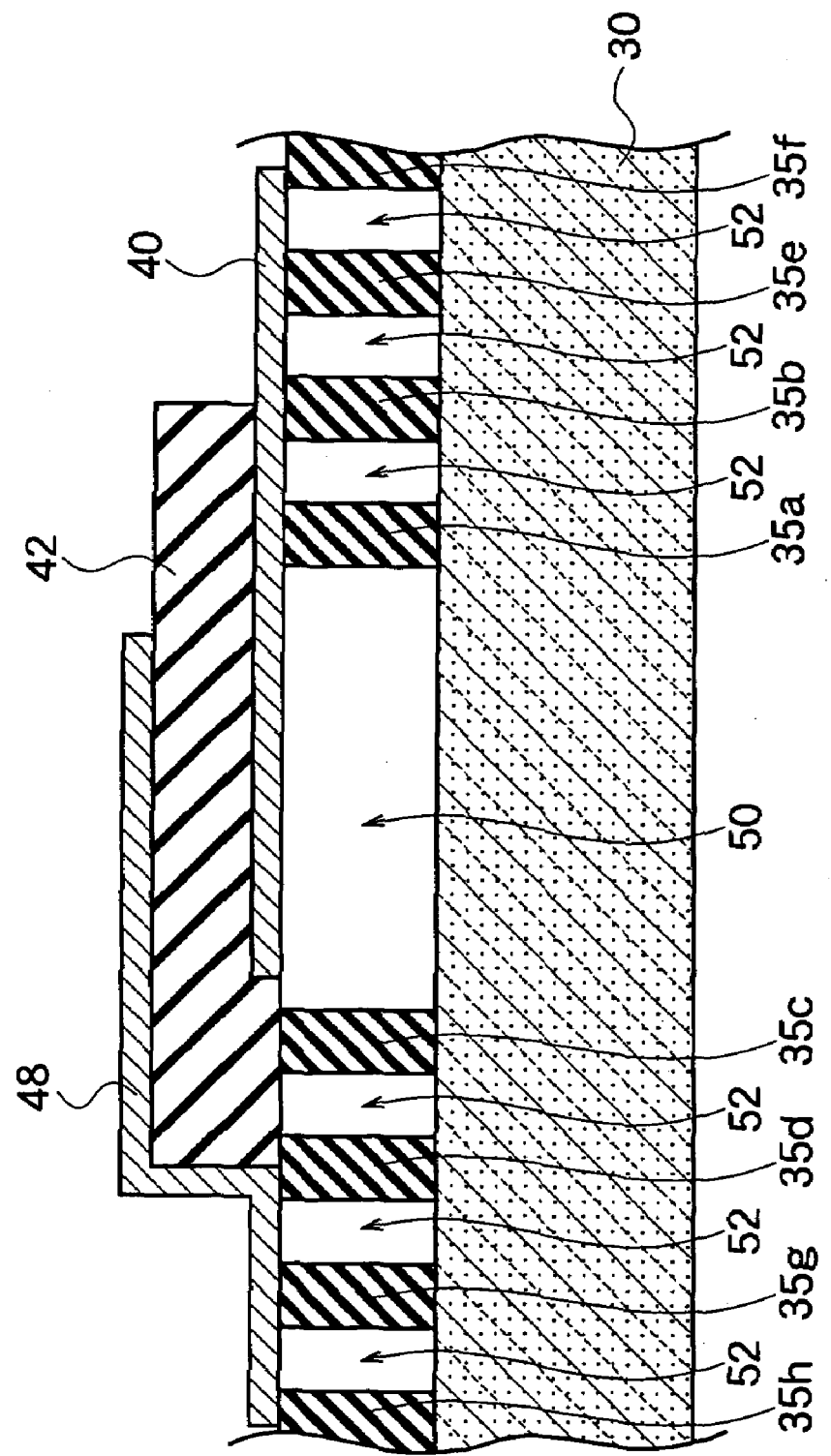

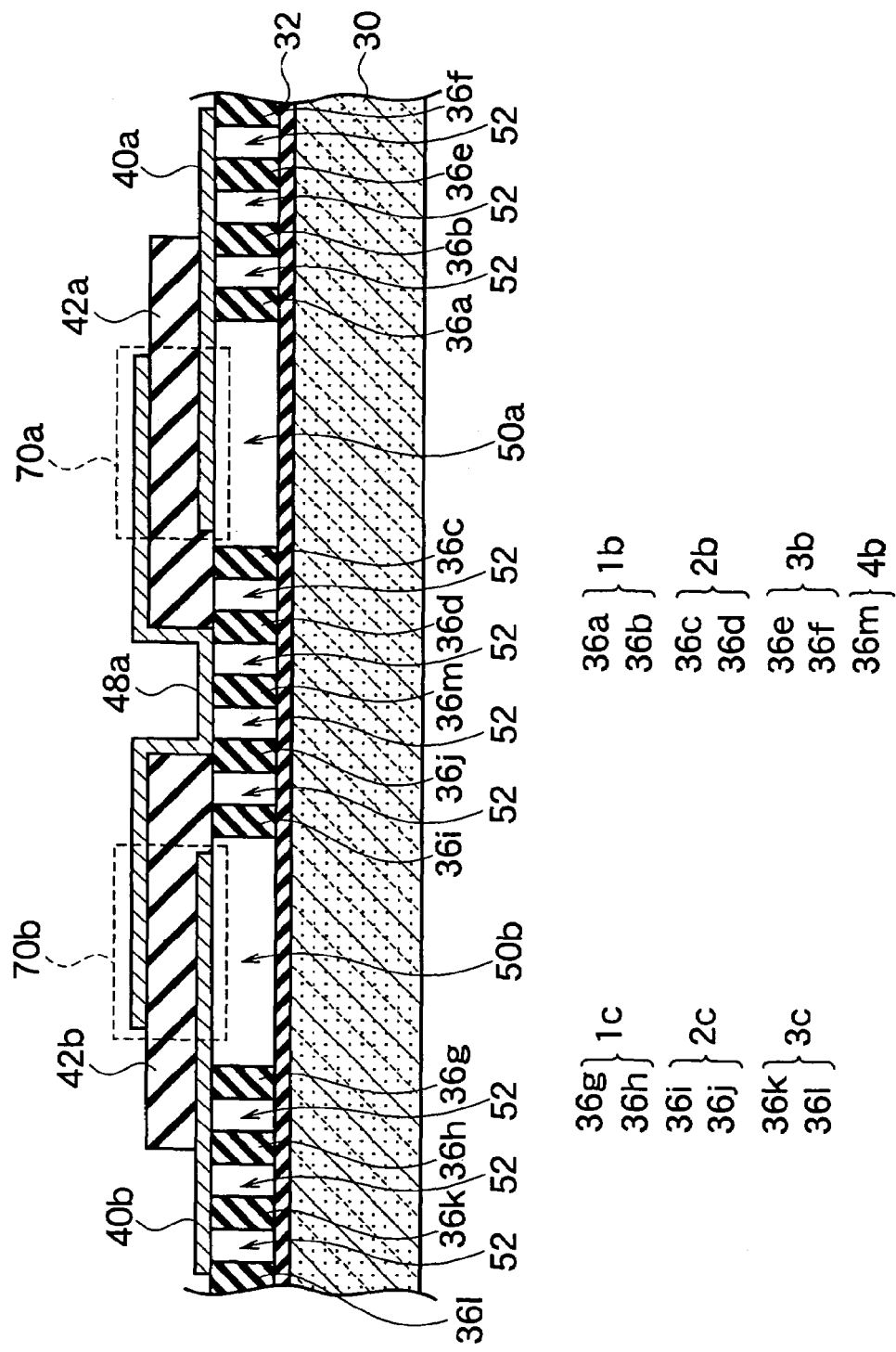

US 7,321,183 B2

FILM BULK ACOUSTIC RESONATOR AND METHOD FOR MANUFACTURING THE SAME

CROSS REFERENCE TO RELATED APPLICATIONS

This application is based upon and claims the benefit of priority from prior Japanese Patent Application P2003-431235 filed on Dec. 25, 2003; the entire contents of which are incorporated by reference herein.

BACKGROUND OF THE INVENTION

1. Field of the Invention

The present invention relates to acoustic resonators, and more specifically, to film bulk acoustic resonators used in high frequency bands, as well as a manufacturing method for resonators.

2. Description of the Related Art

Recently, wireless communication systems such as mobile telecommunication devices, and high-speed data transfer wireless local area networks (LAN) use high frequency bands which exceed the GHz range. A film bulk acoustic resonator (FBAR) is used as a high frequency element in the high frequency electronic equipment of these types of wireless communication systems. In the past, bulk (ceramic) dielectric resonators, surface acoustic wave elements (SAW) have been used as resonators for high frequency bands. Compared to these resonators, the FBAR is better suited for miniaturization, and has attributes allowing the FBAR to better respond to even higher frequencies. Thus, development is advancing in high frequency filters and resonance circuits using the FBAR.

For the basic structure of the FBAR, a film of piezoelectric material such as aluminum nitride (AlN) or zinc oxide (ZnO) is sandwiched between two electrodes. To attain high performance, a resonator of the FBAR is positioned so as to be suspended over a cavity. For instance, in a stacked cavity FBAR, a sacrificial layer, which serves to build up a structure to be removed in the very last step, is deposited on a support substrate. After processing the sacrificial layer, a bottom electrode, a piezoelectric film, and a top electrode are formed in sequence so as to cover the sacrificial layer. The cavity is then formed in the bottom region of the resonator of the FBAR by removing the sacrificial layer.

AlN film, which is widely used as a piezoelectric film, easily accumulates a high film stress of several hundred MPa to GPa. When stress accumulates on a step region of the stacked cavity FBAR in particular, cracks occur easily. In order to attain desirable piezoelectric properties, the c axis of the hexagonal AlN film is formed so as to be oriented along the direction in which the top and bottom electrodes oppose one another. The orientation of the AlN film changes at the step region of the stacked cavity FBAR. The change in orientation is why there is a problem with the deterioration of piezoelectric properties.

In the process of treating stacked cavity, an edge of the sacrificial layer is given a slant of 20 degrees or less, in order to mitigate the effects of the step region. By doing this, the accumulation of stress on the AlN film deposited on the step region of the slant treated sacrificial layer is mitigated, suppressing the occurrence of cracks. However, providing the slant treatment is very difficult. Disruption of the orientation of the AlN film deposited on the step region of the slant treated sacrificial layer also occurs, leading to a deterioration of piezoelectric properties.

Regarding the above problem, the following method of fabricating an FBAR on a flat substrate surface has been proposed. For instance, after oxidizing a surface of a recess formed on a silicon (Si) substrate, a sacrificial layer is buried into the recess for planarization. Subsequently, a bottom electrode, an AlN film, and a top electrode are formed so as to cover the sacrificial layer, which planarizes the recess. After that, the FBAR is fabricated on a cavity formed by removing the buried sacrificial layer (refer to U.S. Pat. No. 6,060,818).

In another method of fabricating an FBAR (refer to U.S. Pat. No. 6,355,498), a bottom electrode, an AlN film, and a top electrode are formed on an insulating film deposited on a surface of an Si substrate, then a cavity is formed in the underside of the bottom electrode through a via that runs through the AlN layer.

In the FBAR proposed in U.S. Pat. No. 6,060,818, and U.S. Pat. No. 6,355,498, the bottom electrode, the AlN film, and the top electrode are formed over the surface of the flat substrate. Therefore, integrity problems due to stress caused cracks in the AlN film, and problems with deterioration of the piezoelectric properties due to disruption in the orientation of the AlN film are suppressed.

On the other hand, wiring that is connected to the bottom electrode is provided on the insulating layer such as silicon oxide ($SiO_2$), which is provided on the substrate to support the FBAR. Also, the wiring spreading from the top electrode, and the bonding pad, etc. is also provided on the insulating layer on the substrate surface. However, when using the FBAR merged with a semiconductor device such as a complementary metal-oxide-semiconductor (CMOS) circuit on a low resistivity semiconductor substrate, in high frequency band applications in the GHz range, it becomes impossible to overlook the parasitic capacitance between the bonding pad and the wiring on the insulating layer and the low resistivity semiconductor substrate. As a result, the high frequency properties of the FBAR deteriorate.

SUMMARY OF THE INVENTION

A first aspect of the present invention inheres in a film bulk acoustic resonator, including a first insulator pattern; a second insulator pattern disposed apart from the first insulator pattern; a third insulator pattern disposed opposite direction to the second insulator pattern in relation to the first insulating pattern and apart from the first insulating pattern; a fourth insulator pattern disposed opposite direction to the first insulator pattern in relation to the second insulating pattern and apart from the second insulator pattern; a bottom conductive layer disposed above the first and third insulator patterns, spreading from a region between the first and second insulator patterns to the third insulator pattern; a piezoelectric film on the bottom conductive layer, disposed above the region between the first and second insulating patterns; and a top conductive layer facing the bottom conductive layer so as to sandwich the piezoelectric film, the top conductive layer spreading from the region between the first and second insulator patterns to the fourth insulator pattern.

A second aspect of the present invention inheres in a method for manufacturing a film bulk acoustic resonator, including forming first and second sacrificial layers above a substrate, the first sacrificial layer being sandwiched between first and second insulator patterns, the second sacrificial layer being disposed and periodically spaced apart by a third insulator pattern in an opposite region in relation to the first insulator pattern facing the first sacrificial layer and being disposed and periodically spaced apart by a fourth insulator pattern in another opposite region in relation to the second insulator pattern facing the first sacrificial layer, respectively; forming a bottom conductive layer spreading from a region above the first sacrificial layer to a region above the third insulator pattern; forming a piezoelectric film on the bottom conductive layer above the first sacrificial layer; forming a top conductive layer facing the bottom conductive layer so as to sandwich the piezoelectric film, the top conductive layer spreading from the region above the first sacrificial layer to a region above the fourth insulator pattern; and forming first and second cavities corresponding to the first and second sacrificial layers by selectively removing the first and second sacrificial layers situated below the bottom conductive layer, the piezoelectric film, and the top conductive layer.

BRIEF DESCRIPTION OF DRAWINGS

FIG. 5 is a cross sectional view showing an example manufacturing method of the FBAR according to the first embodiment of the present invention.

FIG. 11 is a cross sectional view showing an example manufacturing method of the FBAR according to the first embodiment of the present invention.

FIG. 14 is a cross sectional view showing an example manufacturing method of the FBAR according to the second embodiment of the present invention.

FIG. 19 is a cross sectional view showing an example manufacturing method of the FBAR according to the second embodiment of the present invention

FIG. 21 is a view of the XXI-XXI cross-section showing the FBAR of FIG. 20.

DETAILED DESCRIPTION OF THE INVENTION

Figure 1:
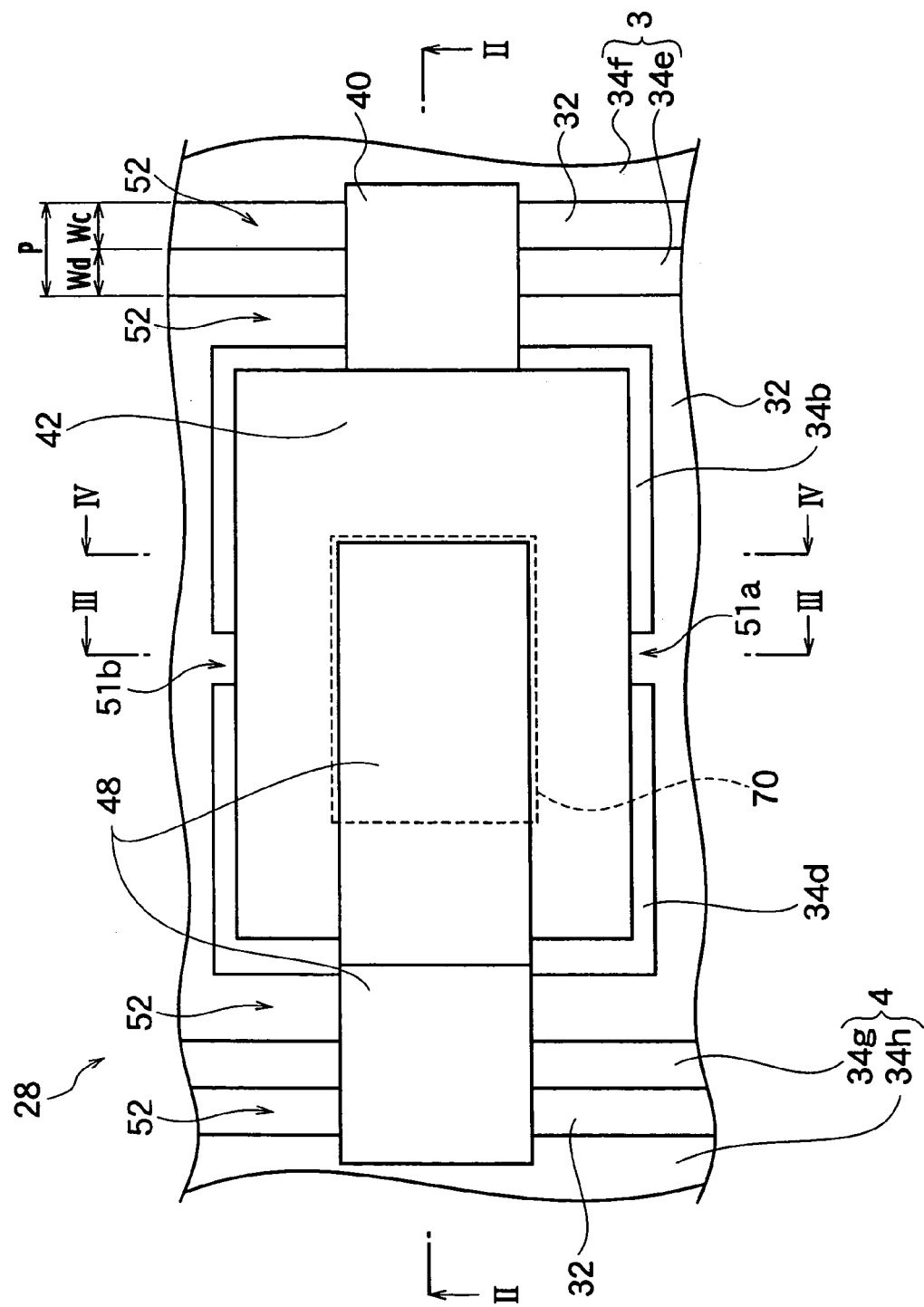
FIG. 1 is a plan view showing an example FBAR according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
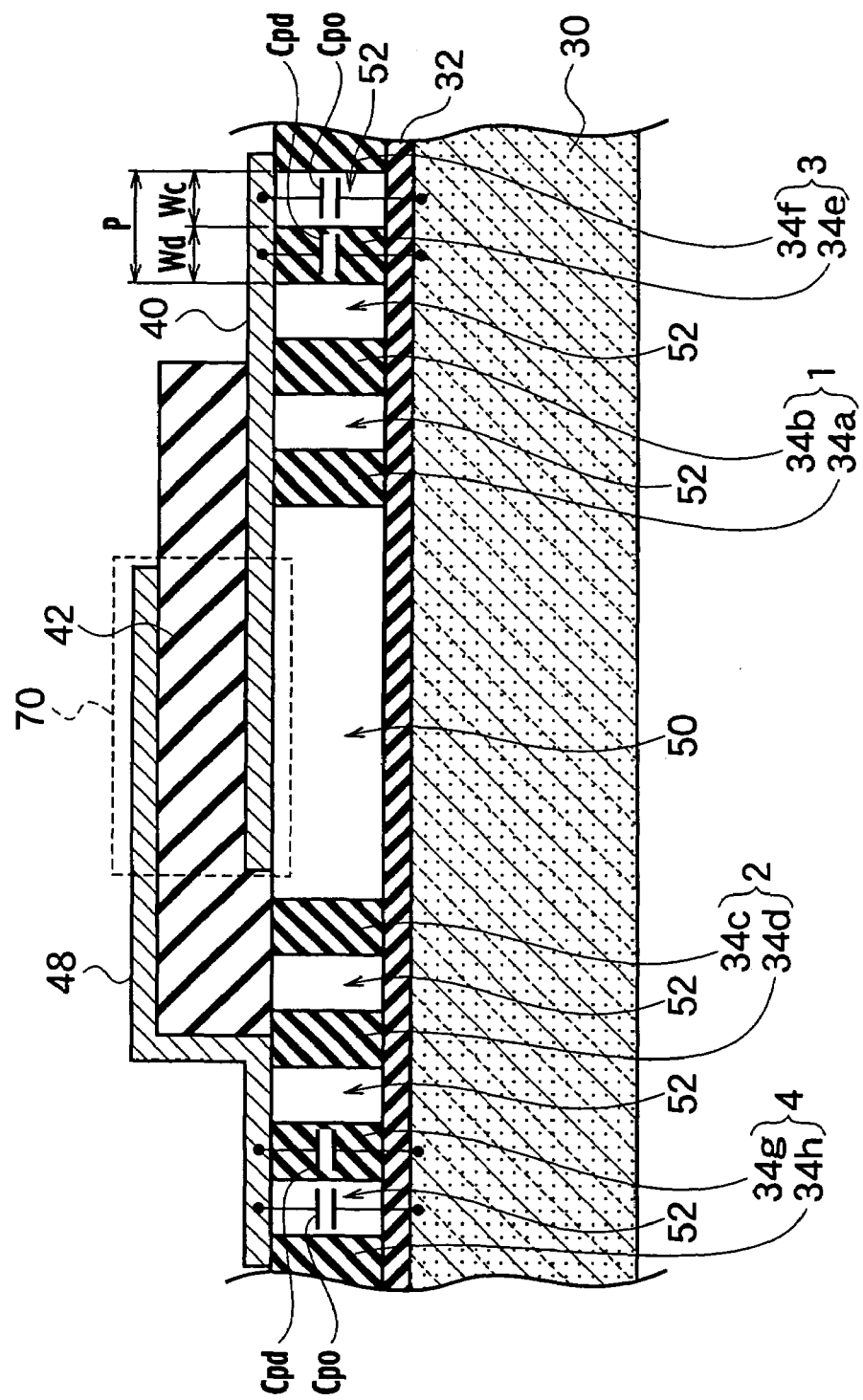
FIG. 2 is a view of the II-II cross-section showing the FBAR in FIG. 1.
Figure 3:
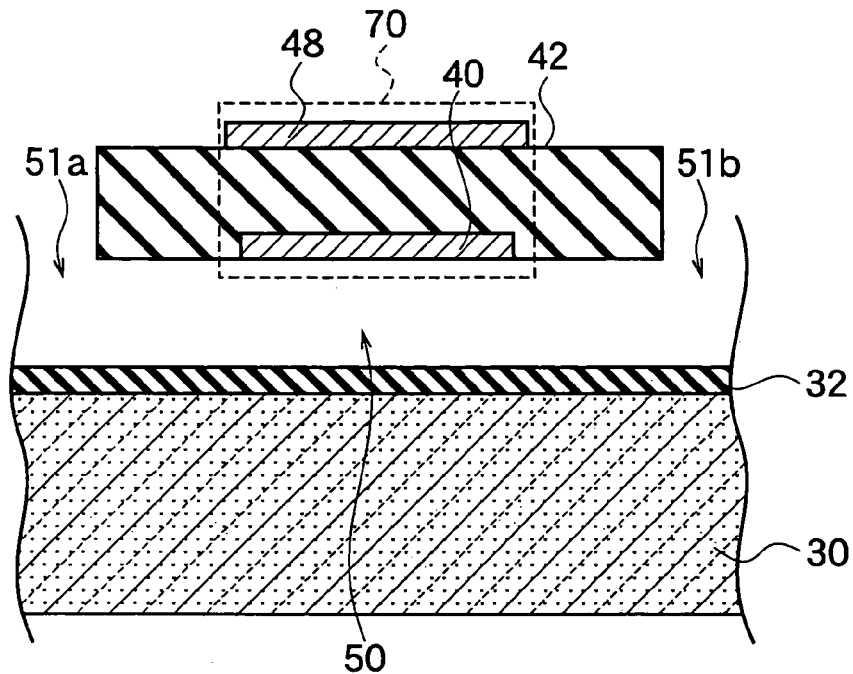
FIG. 3 is a view of the III-III cross-section showing the FBAR in FIG. 1.

An FBAR 28 according to the first embodiment of the present invention, as shown in FIG. 1 and FIG. 2, provides a first insulator pattern 1, a second insulator pattern 2 that is disposed in a mirror symmetry apart from the first insulator pattern 1, a third insulator pattern 3 that is disposed apart from the first insulator pattern 1, and is situated opposite the second insulator pattern 2 with respect to the first insulating layer 1. A fourth insulator pattern 4 is disposed apart from the second insulator pattern 2, and situated opposite the first insulator pattern 1 with respect to the second insulator pattern 2.

A bottom conductive layer 40 spreads from the interior of the region surrounded by the first and second insulator patterns 1 and 2 to the tops of the first insulator pattern 1 and the third insulator pattern 3. A piezoelectric film 42 is disposed on the outer edge of the first and second insulator patterns 1 and 2, and is provided on the surface of the bottom conductive layer 40 of the region surrounded by the first and second insulator patterns 1 and 2. A top conductive layer 48 is provided sandwiching the piezoelectric film 42 and spreads to the tops of the second insulator pattern 2 and the fourth insulator pattern 4 opposing the region surrounded by the bottom conductive layer 40 and the first and second insulator patterns 1 and 2.

The first through fourth insulator patterns 1 through 4 are provided on an underlying layer 32, which lies on a substrate 30. A semiconductor substrate comprised of a substance such as Si is used as the substrate 30. A thermally oxidized film is used as the underlying layer 32. Substances such as spin on glass (SOG) and phosphosilicate glass (PSG) are used as the first through fourth insulator patterns 1 through 4. Refractory metals such as molybdenum (Mo), tungsten (W), and titanium (Ti), or refractory metal compounds are used as the bottom conductive layer 40 and the top conductive layer 48. An AlN film is used as the piezoelectric film 42.

As shown in FIGS. 1 to 4, a first ridge 34a of the first insulator pattern 1 and a third ridge 34c of the second insulator pattern 2 both sandwich a gap 51a, 51b from opposite sides. Also, a second ridge 34b of the first insulator pattern 1 and a fourth ridge 34d of the second insulator pattern 2 both sandwich a gap 51a, 51b from opposite sides. The first ridge 34a and the second ridge 34b are disposed surrounding a rectangular-shaped first cavity 50. In the plane of the pages of FIGS. 1 and 2, a fifth ridge 34e and a sixth ridge 34f of the third insulator pattern 3 are disposed in the region to the right of the second ridge 34b spanning the vertical directions in the plane of the figures. In the plane of the pages of FIGS. 1 and 2, a seventh ridge 34g and an eighth ridge 34h of the fourth insulator pattern 4 are disposed in the region to the left of the fourth ridge 34d spanning the vertical directions in the plane of the figures.

In addition, it should be noted that although the first through fourth insulator patterns 1 through 4 are each shown to have two insulating layer ridges disposed thereon, this is for the purpose of simplifying the explanation, and does in no way limit the number of ridges that can be provided. For instance, it is completely acceptable for each of the first through fourth insulator patterns 1 through 4 to have a single insulating layer ridge, or three or more insulating layer ridges.

Further, as shown in FIGS. 1 and 2, there is a second cavity 52 provided inbetween the first and second ridges 34a and 34b, inbetween the third and fourth ridges 34c and 34d, inbetween the fifth and sixth ridges 34e and 34f, and inbetween the seventh and eight ridges 34g and 34h. Also, there is the second cavity 52 provided inbetween the second and fifth ridges 34b and 34e, and inbetween the fourth and the seventh ridges 34d and 34g. In the Figures. "P" represents one "period" composed of one ridge and one cavity. The first through eighth ridges 34a through 34h are each disposed so as to sandwich the second cavity 52 in periods of P and have a width of Wd. Also, the widths of the cavity 52 (Wc) inbetween each of the first through eighth ridges 34a through 34h, and widths of the first through eighth ridges 34a through 34h (Wd) are roughly the same.

Figure 4:
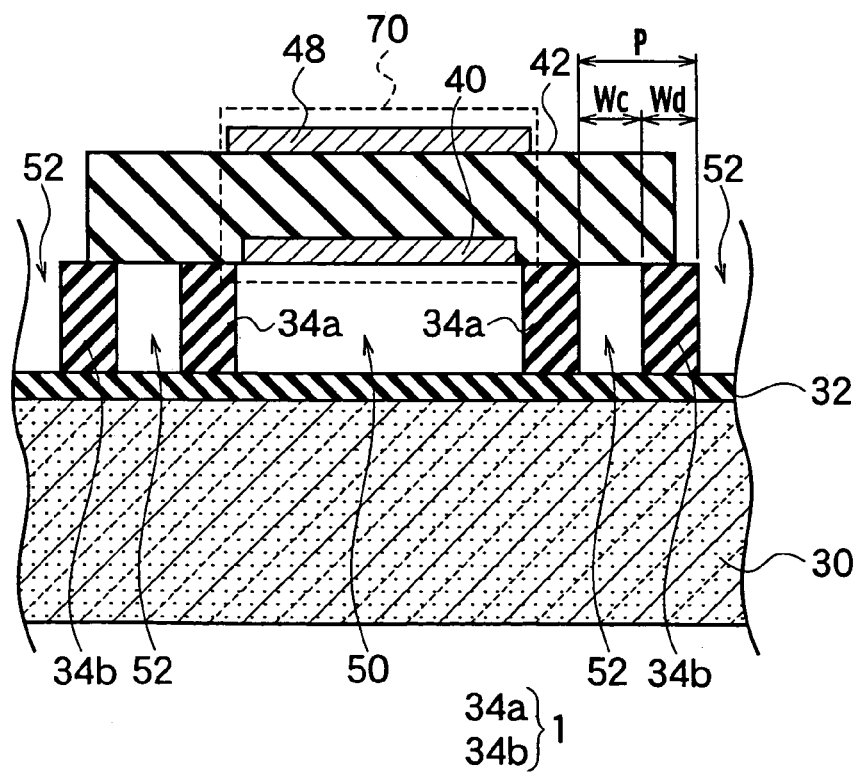
FIG. 4 is a view of the IV-IV cross-section showing the FBAR in FIG. 1.

The bottom conductive layer 40 of the FBAR 28 is, as shown in FIG. 2, disposed spreading from near the third ridge 34c of the second insulator pattern 2 to the tops of the first and second ridges 34a and 34b of the first insulator pattern 1, and the fifth and sixth ridges 34e and 34f of the third insulator pattern 3. In FIG. 4, the bottom conductive layer 40 is disposed above the first cavity 50 within the inner edge of the first ridge 34a, in the direction perpendicular to the direction spanned by the bottom conductive layer 40 of FIG. 2. In the same manner, the bottom conductive layer 40 is disposed above the first cavity 50 within the inner edge of the third ridge (Reference to Figures. omitted).

As shown in FIGS. 1 to 4, the piezoelectric film 42 is disposed to cover the region from the second ridge 34b of the first insulator pattern 1 to the fourth ridge 34d of the second insulator pattern 2 nearly reaching the outer edge of each. The piezoelectric film 42 is supported by the first through fourth ridges 34a through 34d. The first cavity 50 as well as the second cavity 52, which is between the first and second ridges 34a and 34b and the third and fourth ridges 34c and 34d, are covered by the piezoelectric film 42. The piezoelectric film 42 is provided on the part of the bottom conductive layer 40 spanning the first cavity 50 onto the second ridge 34b. Part of the gaps 51a and 51b provided between the first and third ridges 34a and 34c, and between the second and fourth ridges 34b and 34d, spread to the outside of the piezoelectric film 42.

As shown in FIGS. 1 to 4, the top conductive layer 48 is disposed on the surface of the piezoelectric film 42 in the region above the first cavity 50, and sandwiches the piezoelectric film 42 opposite part of the bottom conductive layer 40. The top conductive layer 48 spreads from atop the piezoelectric film 42, contacting part of the fourth ridge 34d, and ends atop the seventh and eighth ridges 34g and 34h. In order to prevent processing errors, the top conductive layer 48 is given a width greater than that of the bottom conductive layer 40.

In the FBAR 28, a resonator 70 is formed by the piezoelectric film 42 being sandwiched by the opposing top conductive layer 48 and the bottom conductive layer 40 from opposite sides above the first cavity 50. In the piezoelectric film 42 of the resonator 70, a high frequency signal is transmitted by the vibration of the bulk acoustic waves excited by the high frequency signal applied to the top and bottom conductive layers 40 and 48. For instance, the GHz range high frequency signal applied from the bottom conductive layer 40 passes through the resonator 70 and is transmitted to the top conductive layer 48. In order to achieve desirable resonance properties in the resonator 70, the piezoelectric film 42 will display excellent film quality regarding attributes such as its crystal orientation, and consistent film thickness.

The high frequency properties of the FBAR 28 will deteriorate due to the wiring resistance of the bottom conductive layer 40 and the top conductive layer 48, and the parasitic capacitance occurring between the bottom conductive layer 40, top conductive layer 48 and the substrate 30. In order to reduce the wiring resistance, it is effective to increase the width and decrease the length of the wiring. However, when handling high frequency signals, due to the "skin effect", there are limitations on the thickness of the effective wiring. Here, the "skin effect" is defined as an effect characteristic of current distribution in a conductor at high frequencies by virtue of which the current density is greater near the surface of the conductor than in its interior. If the width of the wiring is increased even more, the amount of parasitic capacitance Cpd, Cpo occurring between the bottom conductive layer 40, top conductive layer 48 and the substrate 30 shown in FIG. 2 for instance, will increase.

With the FBAR 28 according to the first embodiment of the present invention, resistance according to wiring can be reduced by making the wiring width of the bottom conductive layer 40 and the top conductive layer 48 the same as that of the resonator 70. The bottom conductive layer 40 is disposed on the first and second ridges 34a and 34b of the first insulator pattern 1, the fifth and sixth ridges 34e and 34f of the third insulator pattern 3, as well as the second cavity 52 provided between each of the first, second, fifth, and sixth ridges 34a, 34b, 34e, and 34f. The top conductive layer 48 is disposed on part of the fourth ridge 34d of the second insulator pattern 2, the seventh and eighth ridges 34g and 34h of the fourth insulator pattern 4, as well as the second cavity 52 provided between each of the fourth, seventh, and eighth ridges 34d, 34g, and 34h.

As mentioned above, the widths Wd, Wc of the first through eighth ridges 34a through 34h and the second cavity 52 are roughly the same. Here the relative permittivity of the SOG used for the first through eighth ridges 34a through 34h is $k_{sog}$. The relative permittivity $k_{sog}$ of 2.2 to 2.5 is large compared to the relative permittivity of air ($k \approx 1$). The contribution by the second cavity 52 to the parasitic capacitance Cpo occurring between the bottom conductive layer 40, top conductive layer 48 and the substrate 30 when compared to the contribution by the fifth and seventh ridges 34e and 34g to the parasitic capacitance Cpd occurring between the bottom conductive layer 40, top conductive layer 48 and the substrate 30, is approximately $1/k_{sog}$.

Therefore, compared to conventional wiring constructions having the insulating layer made from a material such as SOG, established uniformly underneath the bottom and top conductive layers, the amount of parasitic capacitance between the bottom conductive layer 40, top conductive layer 48 and the substrate 30 is reduced to approximately $\{(1+1/k_{sog})/2\}$. In this manner, in the FBAR 28 according to the first embodiment of the present invention, the amount of parasitic capacitance can be reduced, and deterioration of the high frequency properties can be suppressed.

Also, a part of the resonant waves generated by the applied high frequency signal leaks from the resonator 70 to the piezoelectric film 42 surrounding the resonator. Part of the leaked resonant waves will be further transmitted to the bottom conductive layer 40 and top conductive layer 48 established on the piezoelectric film 42 on the exterior of the resonator. The piezoelectric film 42, first through fourth ridges 34a through 34d that support the bottom conductive layer 40 under the piezoelectric film 42, the bottom conductive layer 40 outside of the piezoelectric film 42, as well as the fifth through eighth ridges 34e through 34h under the top conductive layer 48 are all disposed periodically. Reflection of the resonant waves leaked from the resonator 70 occurs at the piezoelectric film 42, and each of the first through eighth ridges 34a through 34h under the bottom conductive layer 40 and top conductive layer 48. Normally, the reflected waves deviate from the phase of the resonant waves leading to the deterioration of the resonance properties of the FBAR 28.

For instance, it is possible to suppress the phase of the reflected waves of the resonant waves leaked from the resonator so as to avoid the deterioration of the resonance properties by designing the periods of the first through eighth ridges 34a through 34h so as to correspond to an integral multiple of a fourth of a wavelength of a sound wave propagating in the piezoelectric film corresponding to the resonant frequency of the resonant waves. Thus, if the periods of the first through eighth ridges 34a through 34h are set to correspond to the integral multiple of a fourth of the wavelength of the sound wave propagating in the piezoelectric film, the deterioration of the resonance of the FBAR 28 can be reduced.

Next, the production method of the FBAR 28 according to the first embodiment of the present invention will be described using the cross section views and plane views of FIGS. 5 to 11. Here, the cross section view used in the description corresponds to the cross section from the II-II line shown in FIG. 1.

As shown in FIG. 5, an underlying layer 32 made from a material such as a thermally oxidized film is formed with a thickness of approximately 1 μm on a surface of a substrate 30. The substrate 30 is made from a material such as Si. Using the sputtering process, a buffer layer 54 made from a substance such as tantalum aluminum (TaAl) and a sacrificial layer 56 made from a substance such as Al for instance, are deposited in order on the surface of the underlying layer 32. Thicknesses of the buffer layer 54 and the sacrificial layer 56 are approximately 10 nm and 1 μm respectfully.

Figure 6A:
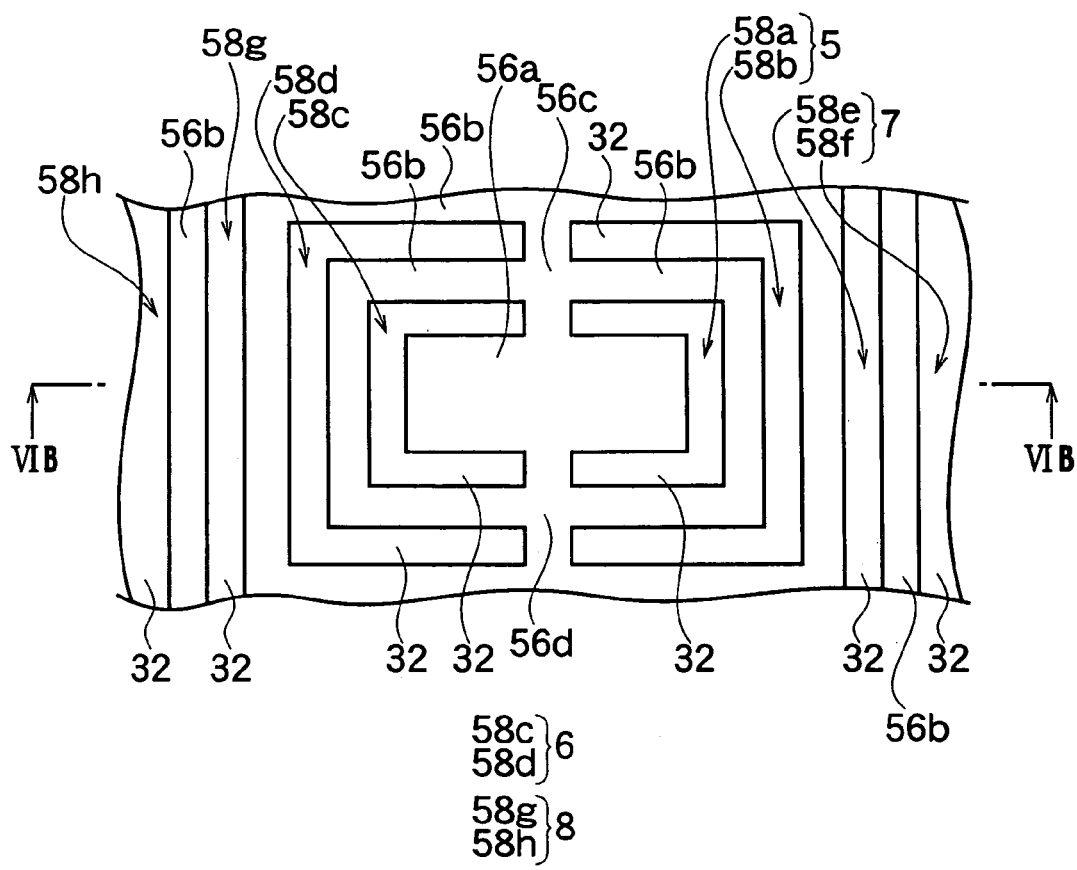
FIGS. 6A and 6B are a plan view and a cross sectional view showing an example manufacturing method of the FBAR according to the first embodiment of the present invention.

The sacrificial layer 56 and the buffer layer 54 are treated by photoengraving such as by photolithography or reactive ion etching (RIE) processes. As a result, as shown in FIG. 6A, a C-shaped first opening 5 as well as a reverse C-shaped second opening 6 are formed symmetrically facing each other on the surface of the underlying layer 32 and sandwiched by extension members 56c and 56d.

A first groove 58a of the first opening 5 lies opposite a third groove 58c of the second opening 6. A second groove 58b of the first opening 5 lies opposite a fourth groove 58d of the second opening 6. In the plane of the page, a fifth groove 58e and a sixth groove 58f of a third opening 7 span the vertical directions on the right side of the second groove 58b.

Also, in the plane of the page, seventh and eighth grooves 58g and 58h of a fourth opening 8 span the vertical directions on the left side of the fourth groove 58d. A first sacrificial layer 56a is formed between the first groove 58a and the third groove 58c. A second sacrificial layer 56b is provided between the first through eighth grooves 58a though 58h, which surround the first sacrificial layer 56a. The second sacrificial layer 56b as well as the first through eighth grooves 58a through 58h are disposed periodically spaced at intervals of equal width.

Figure 6B:
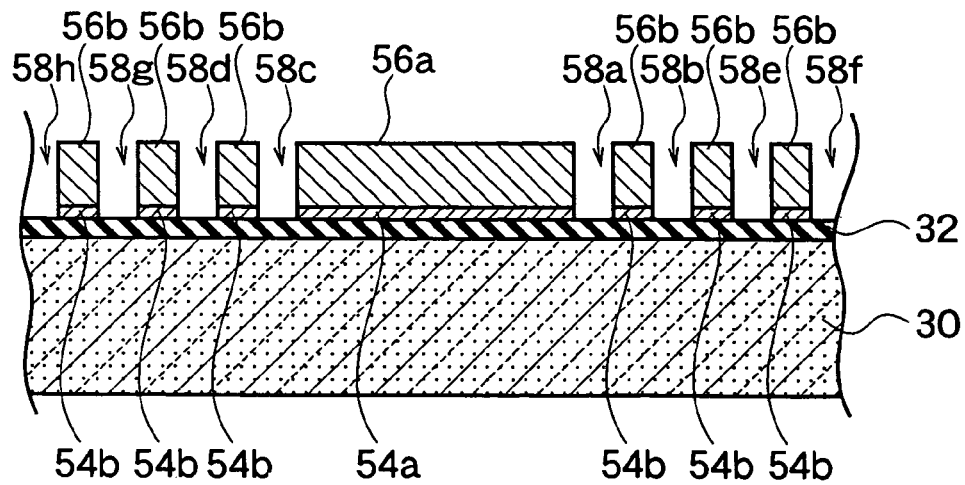

Also, as shown in FIG. 6b, a buffer layer 54a and the first sacrificial layer 56a on the buffer layer 54a are separated from a plurality of buffer layers 54b and the second sacrificial layers 56b on the buffer layers 54b, by the first through eighth grooves 58a through 58h. Further, the form of the first and second openings 5 and 6 is not limited to a C-shape, it is naturally acceptable to form the first and second openings 5 and 6 sandwiching the extension members 56c and 56d in a circular arc, oval arch, or polygonal edge form, or a combination of forms.

Figure 7:
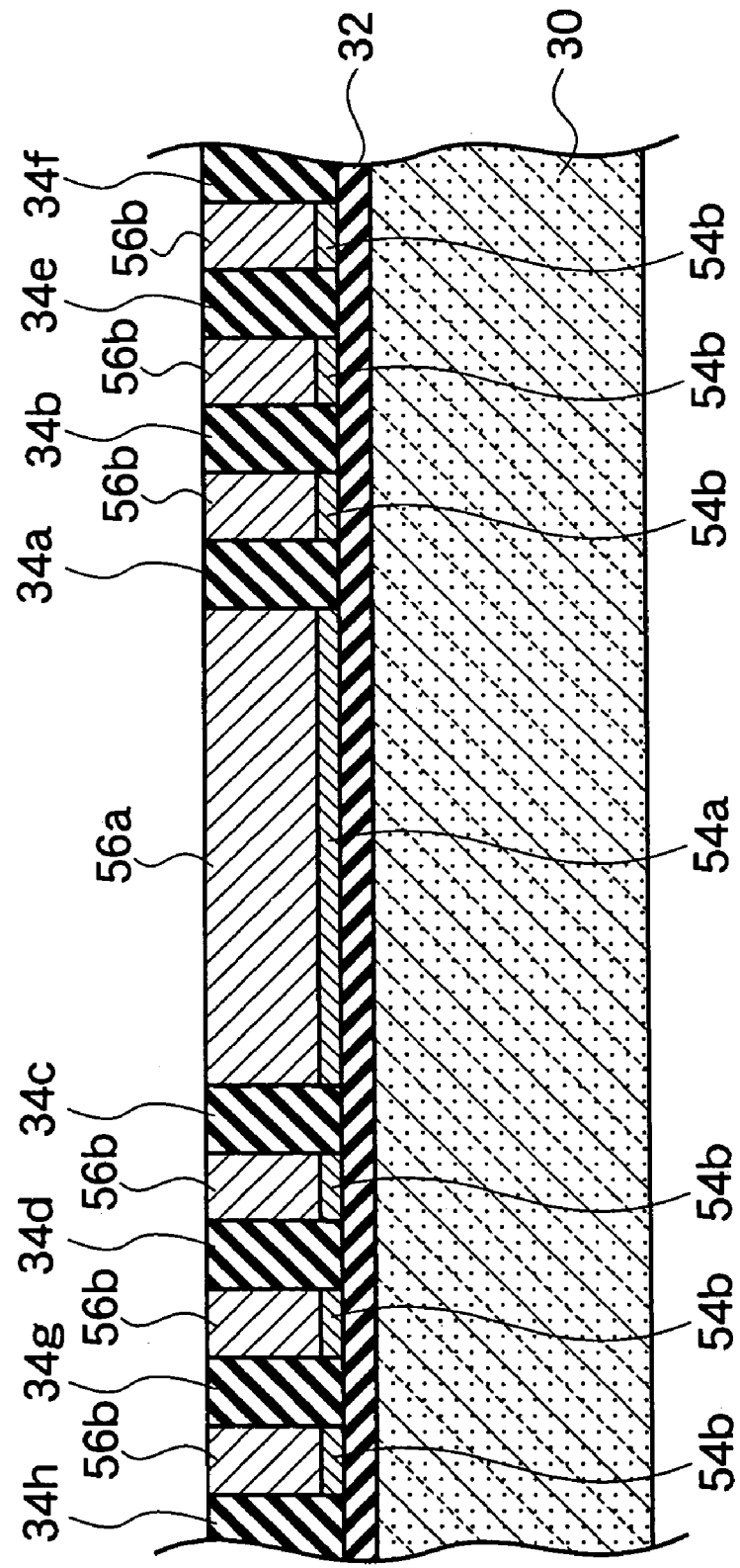
FIG. 7 is a cross sectional view showing an example manufacturing method of the FBAR according to the first embodiment of the present invention.

The surface of the substrate 30, having the first and second sacrificial layers 56a and 56b formed to thereon, is coated with a 1 μm or thicker insulating layer, made from a substance such as SOG, so that the insulating layer fills in the first through eighth grooves 58a through 58h. Next, as shown in FIG. 7, using chemical mechanical polishing (CMP), the insulating layer is planarized in order to expose the surfaces of the first and second sacrificial layers 56a and 56b, forming first through eighth ridges 34a through 34h, which are buried in the first through eighth grooves 58a through 58h, so that the thickness of the ridges equals to the thickness of the surface of the first and second sacrificial layers 56a and 56b.

Figure 8A:
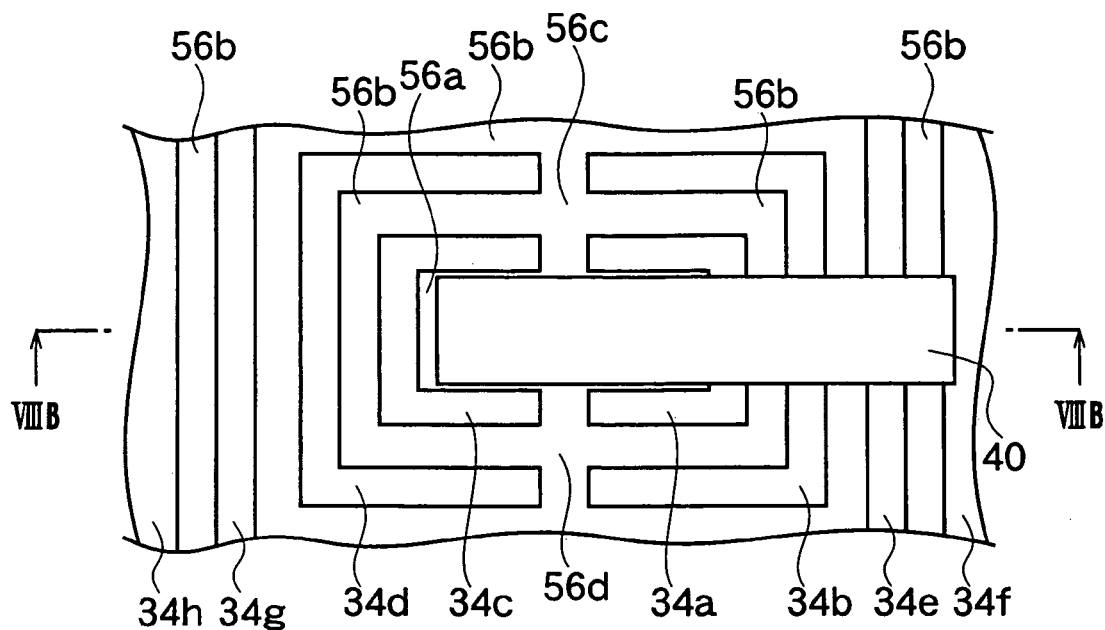
FIGS. 8A and 8B are a plan view and a cross sectional view showing an example manufacturing method of the FBAR according to the first embodiment of the present invention.
Figure 8B:
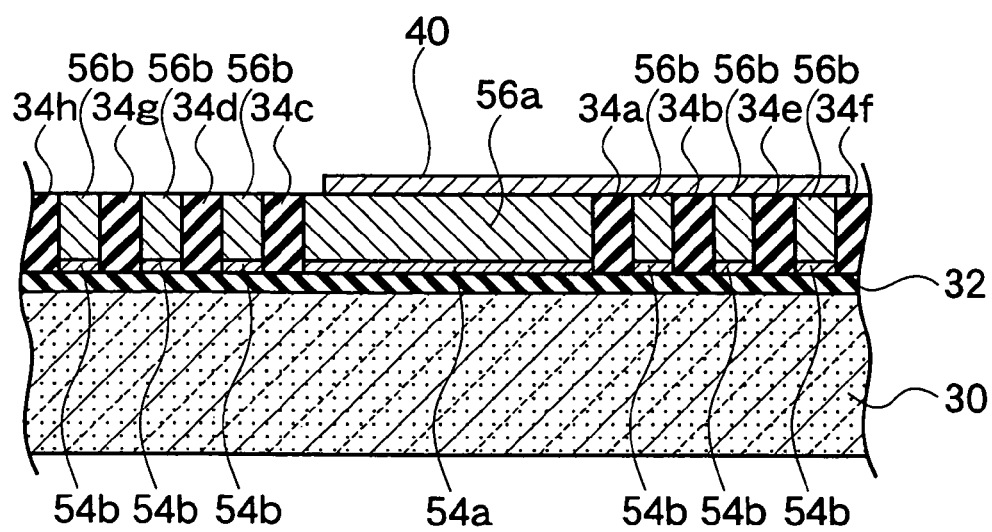

On the surfaces of the planarized first through eighth ridges 34a through 34h and the first and second sacrificial layers 56a and 56b, conductive layers are formed at a thickness of approximately 200 nm to 300 nm using the sputtering process, for instance. Next, as shown in FIGS. 8a and 8b, using the photoengraving process, a bottom conductive layer 40 is formed on the first sacrificial layer 56a spreading from near the third ridge 34c, to the tops of the first and second ridges 34a and 34b, the fifth and sixth ridges 34e and 34f, and the tops of the second sacrificial layer 56b that lies between the first and second ridges 34a and 34b, and the fifth and sixth ridges 34e and 34f. The bottom conductive layer 40 is disposed so that both of sides of the layer, which run parallel to the direction away from one end of the first sacrificial layer 56a, lie within the bounds of the outer edge of the first sacrificial layer 56a.

Figure 9A:
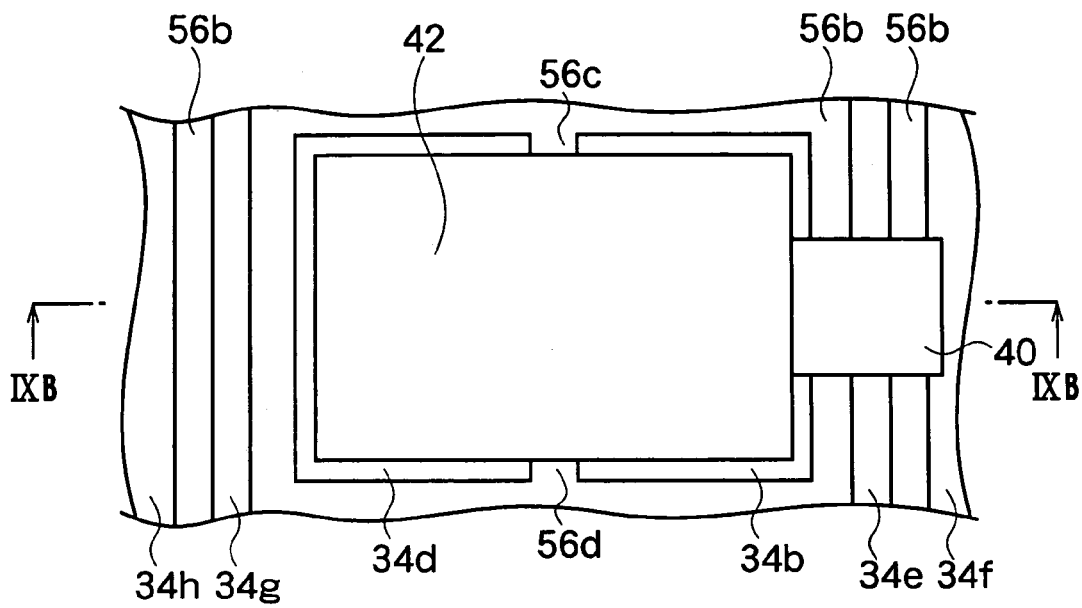
FIGS. 9A and 9B are a plan view and a cross sectional view showing an example manufacturing method of the FBAR according to the first embodiment of the present invention.
Figure 9B:
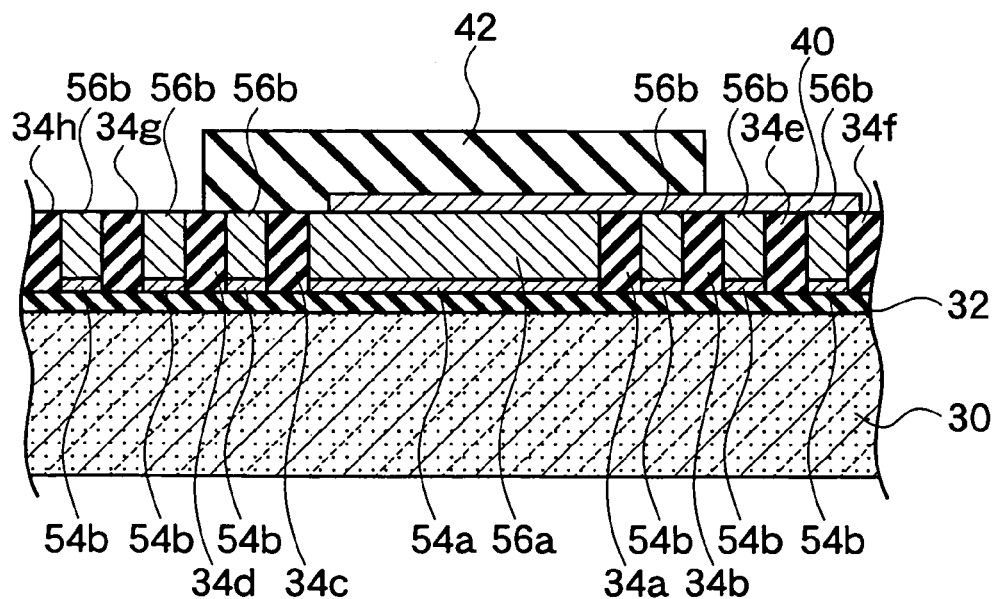

A piezoelectric film, made of a substance such as AlN, is formed on the surface of the bottom conductive layer 40 at a desired thickness using the sputtering process. Next, as shown in FIGS. 9A and 9B, the piezoelectric film 42 is formed to cover the space inbetween the vicinity of the outer rims of the second ridge 34b and the fourth ridge 34d. The first sacrificial layer 56a, and the second sacrificial layer 56b provided between the first and second ridges 34a and 34b, and between the third and fourth ridges 34c and 34d, are covered by the piezoelectric film 42. Part of the surface of the extension members 56c and 56d, which contact the first and second sacrificial layers 56a and 56b under the piezoelectric film 42, are exposed on the outside of the piezoelectric film 42.

Figure 10A:
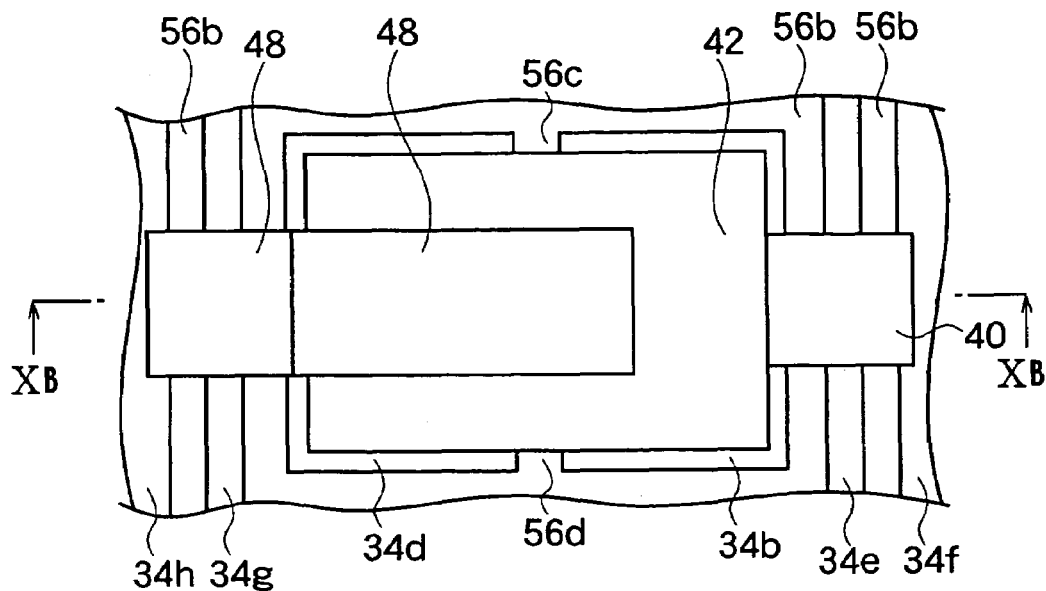
FIGS. 10A and 10B are a plan view and a cross sectional view showing an example manufacturing method of the FBAR according to the first embodiment of the present invention.
Figure 10B:
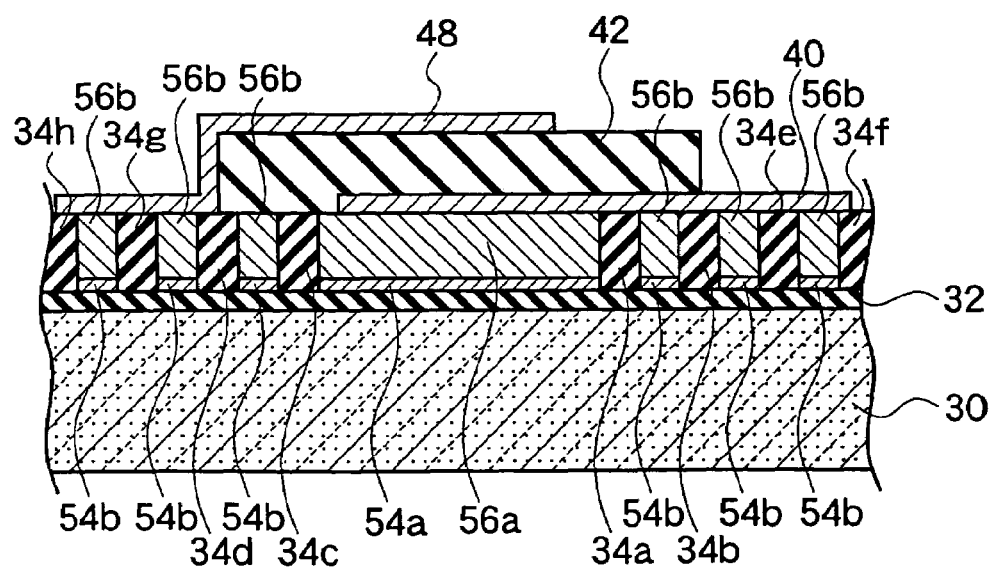

A conductive layer made from a substance such as Mo is formed at a thickness of approximately 200 nm to 300 nm on the surface that includes the bottom conductive layer 40 and the piezoelectric film 42. Next, as shown in FIGS. 10A and 10B, a top conductive layer 48 is formed using the sputtering process, so as to spread from a location opposite the bottom conductive layer 40 on the piezoelectric film 42 and above the first sacrificial layer 56a, to the fourth ridge 34d, the seventh and eighth ridges 34g and 34h, as well as to the second sacrificial layer 56b provided between the fourth and seventh ridges 34d and 34g, and between the seventh and eighth ridges 34g and 34h. The top conductive layer 48 is formed with a greater width than the bottom conductive layer 40 so that processing can be performed with greater precision.

Subsequently, wet etching is performed using a phosphoric acid based acidic solution. As shown in FIG. 10A, the surfaces of the extension members 56c and 56d are exposed on the outside of the piezoelectric film 42. The first sacrificial layer 56a and the buffer layer 54a are selectively etched through the extension members 56c and 56d. The second sacrificial layer 56b and the buffer 54b, which both lie under the piezoelectric film 42, the bottom conductive layer 40, and the upper conductive layer 48 are also selectively etched through the second sacrificial layer 56b exposed on the outside of the piezoelectric film 42. The first and second sacrificial layers 56a and 56b, as well as the buffer layers 54a and 54b are etched away using wet etching, to form first and second cavities 50 and 52, as shown in FIG. 11. Thus, the FBAR 28 according to the first embodiment illustrated in FIGS. 1 to 4 is manufactured.

In the first embodiment, as shown in FIG. 5, because TaAl which has excellent orientation properties is used for the buffer layer 54 on the underlying layer 32, it is possible to arrange the orientation of the sacrificial layer 56, which is made from an Al layer, that is on the buffer layer 54. Therefore, it is also possible to arrange the orientation of the bottom conductive layer 40, which is made from a Mo layer, and the piezoelectric film 42, which is made from an AlN layer, so as to improve the piezoelectric properties of the resonator 70.

According to the manufacturing method of the FBAR 28 according to the first embodiment, the bottom conductive layer 40 is formed above the first and second ridges 34a and 34b of the first insulator pattern 1, above the fifth and sixth ridges 34e and 34f of the third insulator pattern 3, and above the second cavity 52. Also, the top conductive layer 48 is formed above the fourth ridge 34d of the second insulator pattern 2, above the seventh and eighth ridges 34g and 34h of the fourth insulator pattern 4, and above the second cavity 52. Accordingly, it is possible to reduce the amount of parasitic capacitance between the bottom conductive layer 40, the top conductive layer 48 and the substrate 30. Thus, even when using a low resistivity semiconductor substrate as the substrate 30, it is possible to manufacture an FBAR 28 in which the deterioration of its high frequency properties are suppressed. Particularly, it may be effective when using the FBAR 28 merged with a CMOS circuit and the like, on the low resistivity semiconductor substrate.

Second Embodiment

Figure 12:
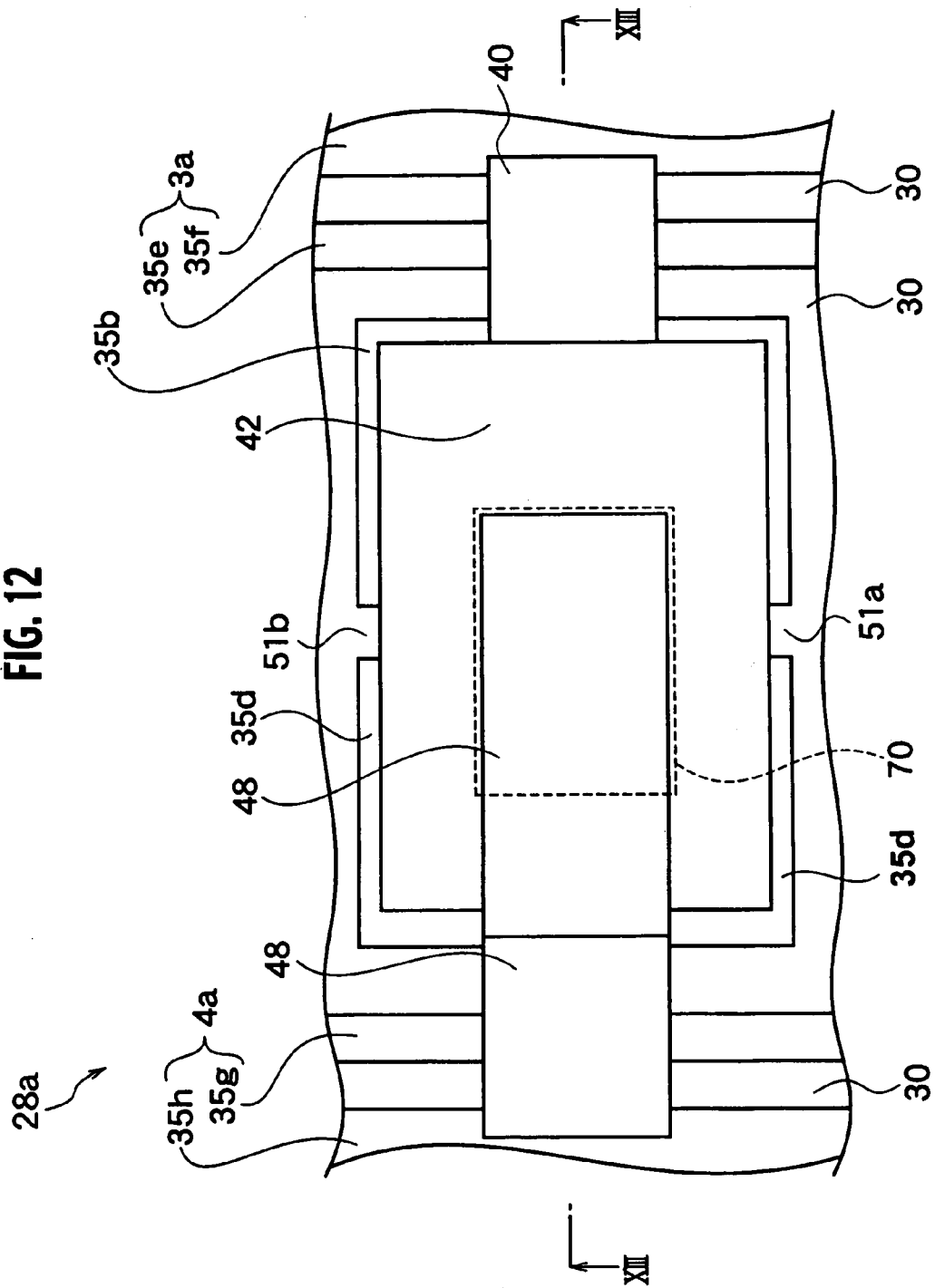
FIG. 12 is a plan view showing an example FBAR according to the second embodiment of the present invention.
Figure 13:
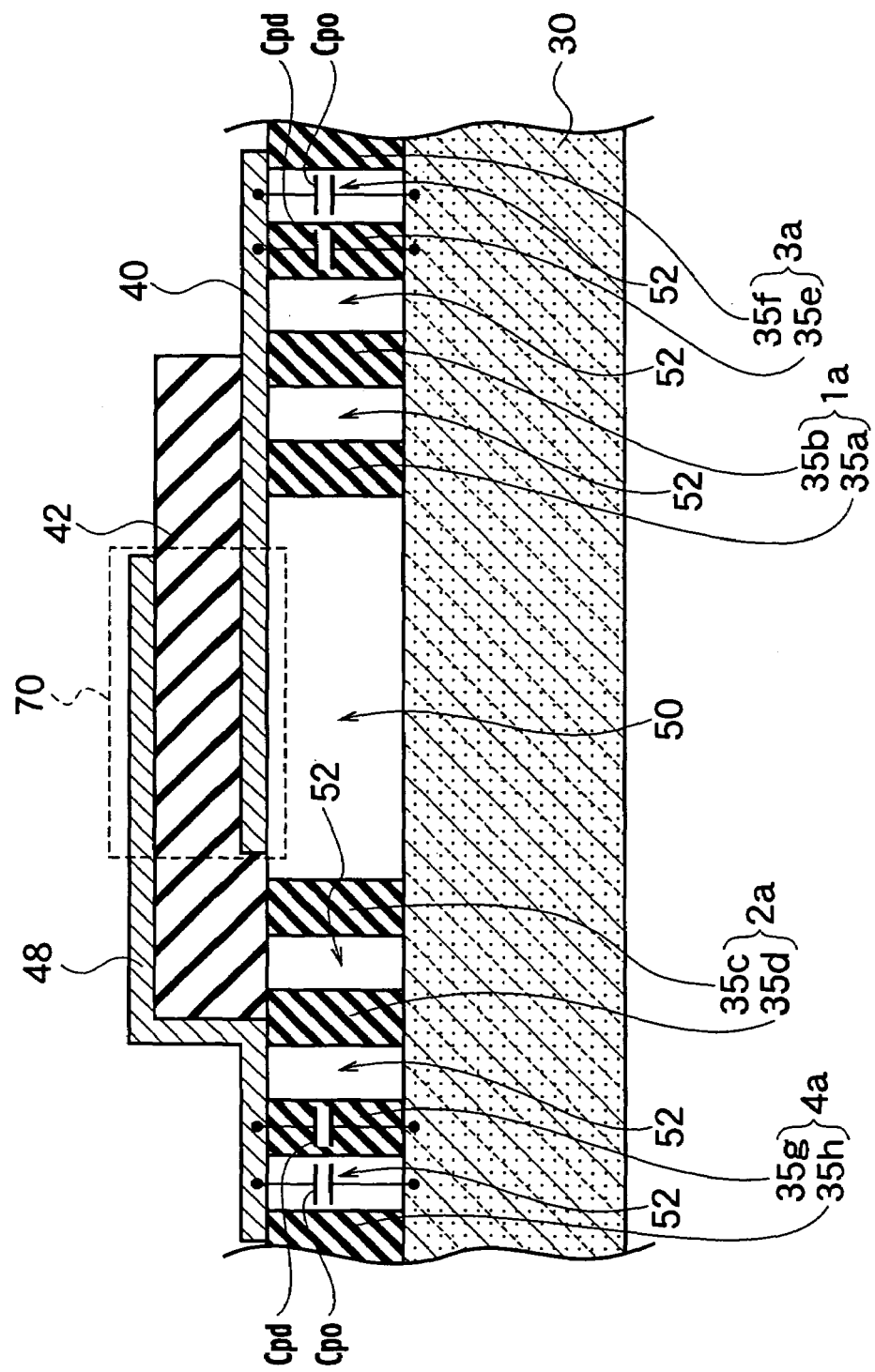
FIG. 13 is a view of the XIII-XIII cross-section showing the FBAR in FIG. 12.

As shown in FIGS. 12 and 13, the FBAR 28a according to the second embodiment of the present invention provides first and second ridges 35a and 35b of a first insulator pattern 1a provided on a substrate 30, third and fourth ridges 35c and 35d of a second insulator pattern 2a, fifth and sixth ridges 35e and 35f of a third insulator pattern 3a, and seventh and eighth ridges 34g and 35h of a fourth insulator pattern 4a, a rectangular shaped bottom conductive layer 40 supported by the eighth ridge 35h, a piezoelectric film 42, and a top conductive layer 48.

In the first embodiment, as shown in FIG. 2, FBAR 28 uses the first through eighth ridges 34a through 34h as supports. The above ridges are made from a material such as SOG and are provided on the underlying layer 32, which is made of a material such as a thermally oxidized film. In the second embodiment, FBAR 28s uses the first through eighth ridges 35a through 35h as supports. In the second embodiment, the part that differs from the first embodiment is that the above ridges are made from a material such as a thermally oxidized film and are provided on the substrate 30. Other structural points of the second embodiment are identical to that of the first embodiment and further redundant discussion is omitted.

With the FBAR 28a according to the second embodiment, the bottom conductive layer 40 is disposed on the first and second ridges 35a and 35b, on the fifth and sixth ridges 35e and 35f, and on the second cavity 52. The top conductive layer 48 is disposed atop the fourth ridge 35d, atop the seventh and eighth ridges 35g and 35h, and atop the second cavity 52. The widths of the first through eighth ridges 35a though 35h as well as the second cavity 52 are roughly equal to the widths of the first embodiment.

For instance, the relative permittivity of the first through eighth ridges 35a through 35h is $k_s$. As shown in FIG. 13, the parasitic capacitance between the bottom conductive layer 40 above the second cavity 52, the top conductive layer 48 and the substrate 30 drops by $1/k_s$ compared to the parasitic capacity between the bottom conductive layer 40 above the fifth and seventh ridges 35e and 35g, the top conductive layer 48 and the substrate 30. Therefore, when compared to past wiring structures in where an insulating layer made of a material such as a thermally oxidized film is evenly provided, it is possible to reduce the amount of parasitic capacitance between the bottom conductive layer 40, the top conductive layer 48, and the substrate 30. In this manner, in the FBAR 28a according to the second embodiment, it is possible to suppress the deterioration of the high frequency properties by cutting the parasitic capacitance. The first through eighth ridges 35a through 35h are disposed periodically. If the periods are designed to correspond to the ¼ integral multiple of the piezoelectric film wavelength corresponding to the resonant frequency of the resonator 70, it is possible to decrease the deterioration of the resonance of the FBAR 28a.

Next, the manufacturing method of the FBAR 28a according to the second embodiment will be described using the cross section and plan views appearing in the accompanying FIGS. 14 to 19. The cross section views appearing here show a cross section corresponding to the XIII-XIII line.

A thermally oxidized film is formed on a surface of a substrate 30 at a thickness of approximately 1 μm, for instance. The substrate 30 is made from a material such as Si. The thermally oxidized film is then treated using photoengraving such as photolithography and RIE processes. As a result, first through eighth ridges 35a through 35h as well as a second opening member 60b are formed surrounding a first opening member 60a on the substrate 30. The first through eighth ridges 35a through 35h and the second opening member 60b are disposed periodically at roughly the same spacing width.

Figure 15A:
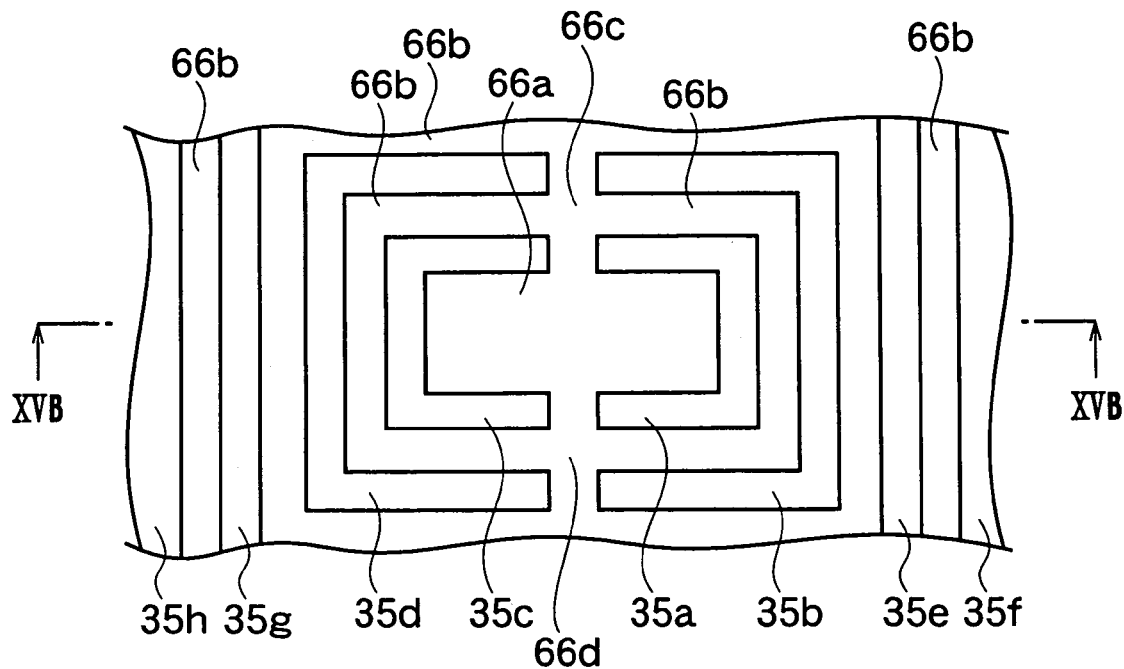
FIGS. 15A and 15B are a plan view and a cross sectional view showing an example manufacturing method of the FBAR according to the second embodiment of the present invention.
Figure 15B:
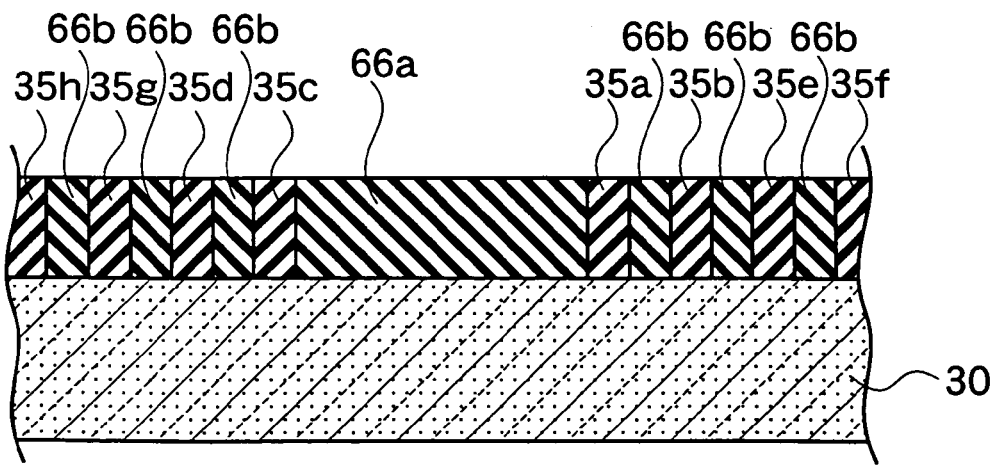

The first through eighth ridges 35a through 35h and the first and second opening members 60a and 60b are formed on the substrate 30. On top of the surface of substrate 30, a sacrificial layer is formed at a thickness of 1 µm or greater so as to fill in the first and second opening members 60a and 60b. The sacrificial layer is made from a material such as PSG, for instance. Next, as shown in FIG. 15A and 15B, using CMP process, the sacrificial layer is planazized in order to expose the first through eighth ridges 35a through 35h. As a result, the C-shaped first and second ridges 35a and 35b, as well as the symmetrically opposing reverse C-shaped third and fourth ridges 35c and 35d are formed so as to sandwich the extension members 66c and 66d. The fifth and sixth ridges 35e and 35f spread in the vertical directions on the right of the second ridge 35b in the plane of the page. Also, the seventh and eighth ridges 35g and 35h spread in the vertical directions to the left of fourth ridge 35d in the plane of the page. A first sacrificial layer 66a is formed between the opposing first and third ridges 35a and 35c. A second sacrificial layer 66b is formed between the first through eighth ridges 35a through 35h surrounding the first sacrificial layer 66a.

Figure 16A:
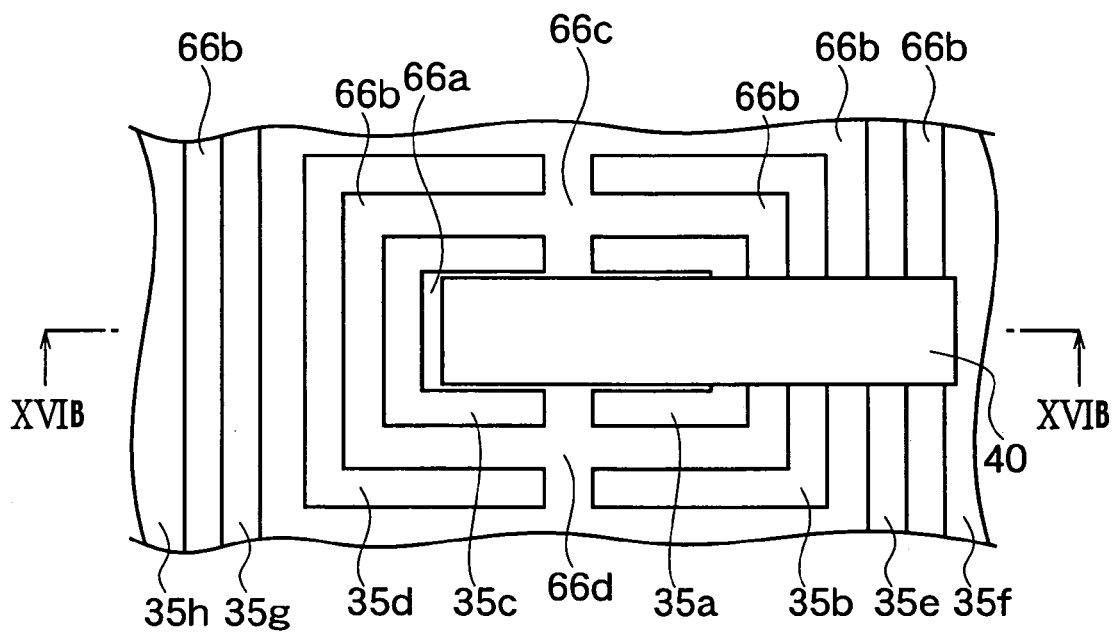
FIGS. 16A and 16B are a plan view and a cross sectional view showing an example manufacturing method of the FBAR according to the second embodiment of the present invention.
Figure 16B:
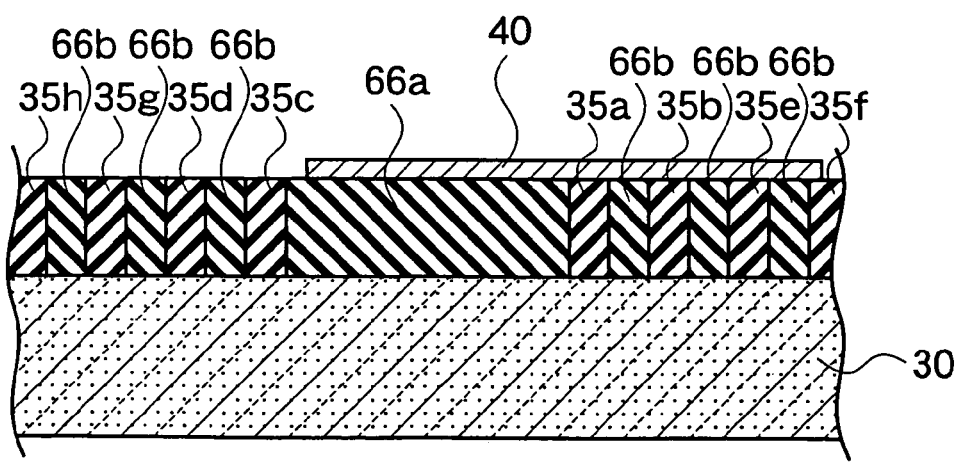

Using the sputtering process, for instance, a conductive layer made from a substance such as Mo is formed at a thickness of approximately 200 nm to 300 nm on the surface that has the first through eighth ridges 35a through 35h as well as the first and second sacrificial layers 66a and 66b. Next, using a photoengraving process, as shown in FIGS. 16A and 16B, a bottom conductive layer 40 is delineated above the first sacrificial layer 66a from near the third ridge 35c spreading over the tops of the first and second ridges 35a and 35b, the tops of the fifth and sixth ridges 35e and 35f, as well as the tops of the sacrificial layer 66b that is between the first and second ridges 35a and 35b, and the fifth and sixth ridges 35e and 35f. The bottom conductive layer 40 is disposed so that both sides, which run parallel to the direction away from one end of the first sacrificial layer 66a, lie within the bounds of the outer edge of the first sacrificial layer 56a.

Figure 17A:
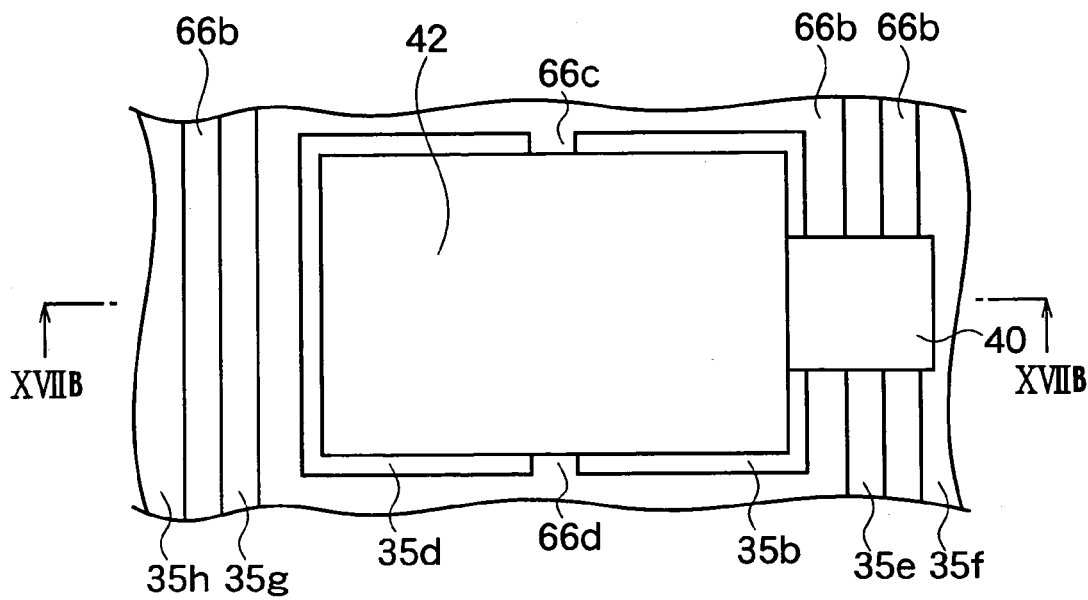
FIGS. 17A and 17B are a plan view and a cross sectional view showing an example manufacturing method of the FBAR according to the second embodiment of the present invention.
Figure 17B:
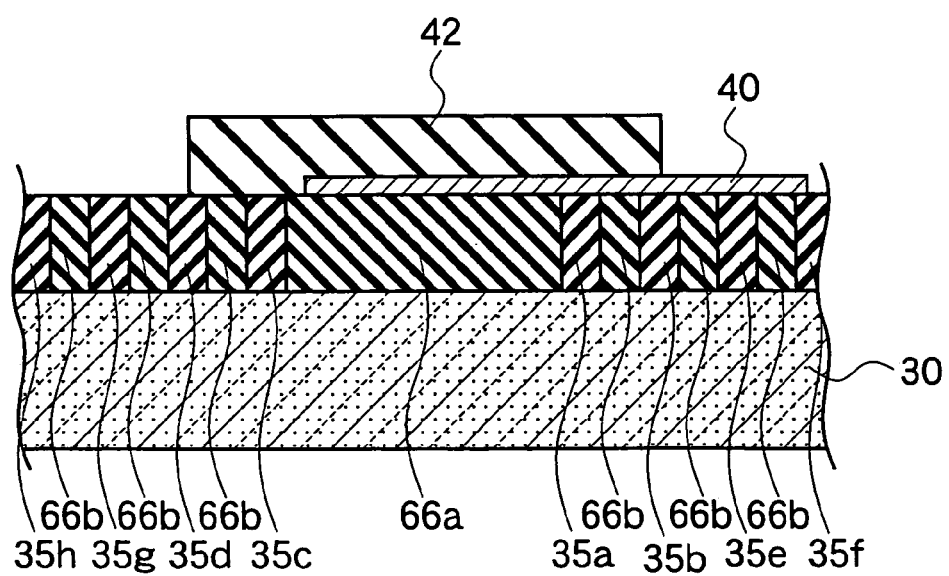

A piezoelectric film made of a material such as AlN is formed at a desired thickness on the surface that has the bottom conductive layer 40 formed on the first through eighth ridges 35a through 35h and the first and second sacrificial layers 66a and 66b. For instance, if the signal frequency is in the GHz range, a piezoelectric film would be formed with a thickness of 2 µm. Next, as shown in FIGS. 17A and 17B, using the photoengraving process, the piezoelectric film 42 is formed to cover the region from the second ridge 35b to the fourth ridge 35d nearly reaching the outer edge of each. The second sacrificial layer 66b is provided between the first and second ridges 35a and 35b and the third and fourth ridges 35c and 35d. The first sacrificial layer 66a and the second sacrificial layer 66b are both covered by the piezoelectric film 42. The extension members 66c and 66d contact the first and second sacrificial layers 66a and 66b under the piezoelectric film 42. Part of the surface of the extension members 66c and 66d are exposed on the outside of the piezoelectric film 42.

Figure 18A:
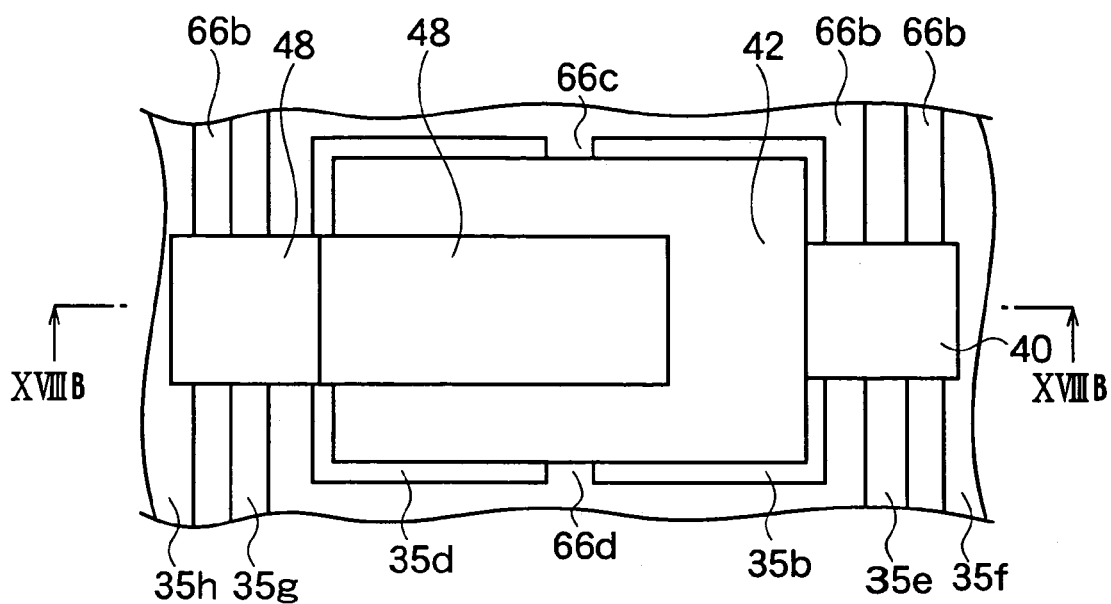
FIGS. 18A and 18B are a plan view and a cross sectional view showing an example manufacturing method of the FBAR according to the second embodiment of the present invention.
Figure 18B:
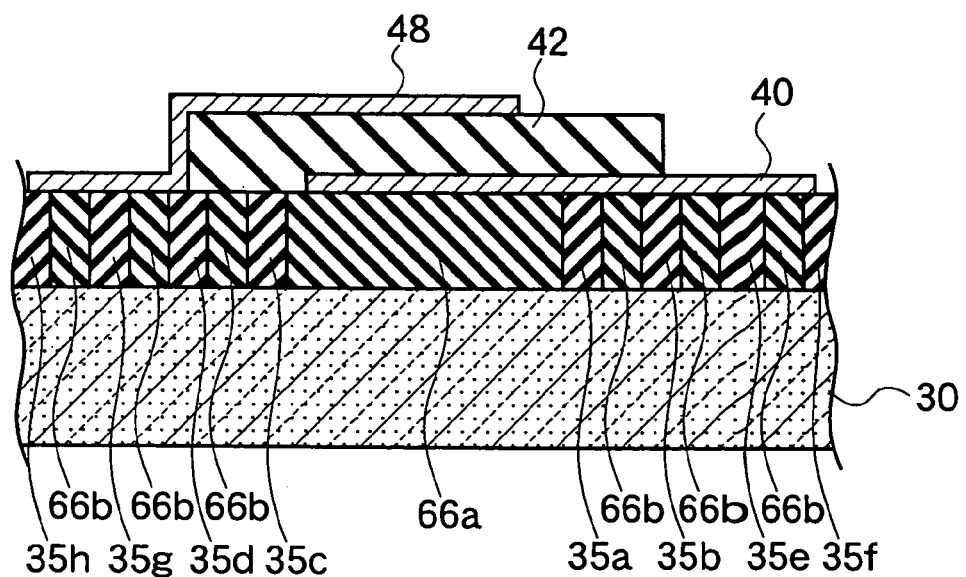

Using the sputtering process for instance, a conductive layer made of a material such as Mo is formed at a thickness of approximately 200 nm to 300 nm on the surface that has the bottom conductive layer 40 and the piezoelectric film 42 formed on the first through eighth ridges 35a through 35h and the first and second sacrificial layers 66a and 66b. Next, as shown in FIGS. 18A and 18B, the top conductive layer 48 is formed using the photoengraving process, for instance, spreading from a location opposite the bottom conductive layer 40 and above the first sacrificial layer 66a, to the fourth ridge 35d, the seventh and eighth ridges 35g and 35h, as well to the second sacrificial layer 66b provided between the fourth and seventh ridges 35d and 35g, and between the seventh and eighth ridges 35g and 35h. The top conductive layer 48 is formed with a greater width than the bottom conductive layer 40 so that processing can be performed with greater precision.

Subsequently, wet etching is performed using a hydrofluoric acid based etchant. When the PSG etching speed used for the first and second sacrificial layers 66a and 66b is compared to the etching speed used for the thermally oxidized film, it is over ten times faster. As shown in FIG. 18A, the surfaces of the extension members 66c and 66d are exposed on the outside of the piezoelectric film 42. The first sacrificial layer 66a is selectively etched away through the extension members 56c and 56d. The second sacrificial layer 66b lying under the piezoelectric film 42, the top conductive layer 48, and the bottom conductive layer 40 is also etched away from the parts of the second sacrificial layer 66b that are exposed on the outside of the piezoelectric film 42. The first and second sacrificial layers 66a and 66b are etched away using wet etching, thus forming the first and second cavities 50 and 52, as shown in FIG. 19. Thus, the FBAR 28a according to the second embodiment shown in FIGS. 12 and 13 is manufactured.

According to the manufacturing method of the FBAR 28a according to the second embodiment, the bottom conductive layer 40 is formed above the first and second ridges 35a and 35b of the first insulator pattern 1a, above the fifth and sixth ridges 35e and 35f of the third insulator pattern 3a, and above the second cavity 52. Also, the top conductive layer 48 is formed above the fourth ridge 35d of the second insulator pattern 2a, above the seventh and eighth ridges 35g and 35h of the fourth insulator pattern 4a, and above the second cavity 52. Accordingly, it is possible to reduce the amount of parasitic capacitance between the bottom conductive layer 40, the top conductive layer 48 and the substrate 30. Thus, even when using a low resistivity semiconductor substrate as the substrate 30, it is possible to produce an FBAR 28a in which the deterioration of its high frequency properties are suppressed. Particularly, it may be effective when using the FBAR 28a merged with a CMOS circuit and the like, on the low resistivity semiconductor substrate.

Other Embodiments

Single FBAR 28 and 28a are used for the description of the first and second embodiments of the present invention. When using an FBAR to form a filter in a high frequency circuit, a plurality of FBARs interconnected in a ladder structure is used. An instance of interconnecting two FBARs will now be described as an example.

Figure 20:
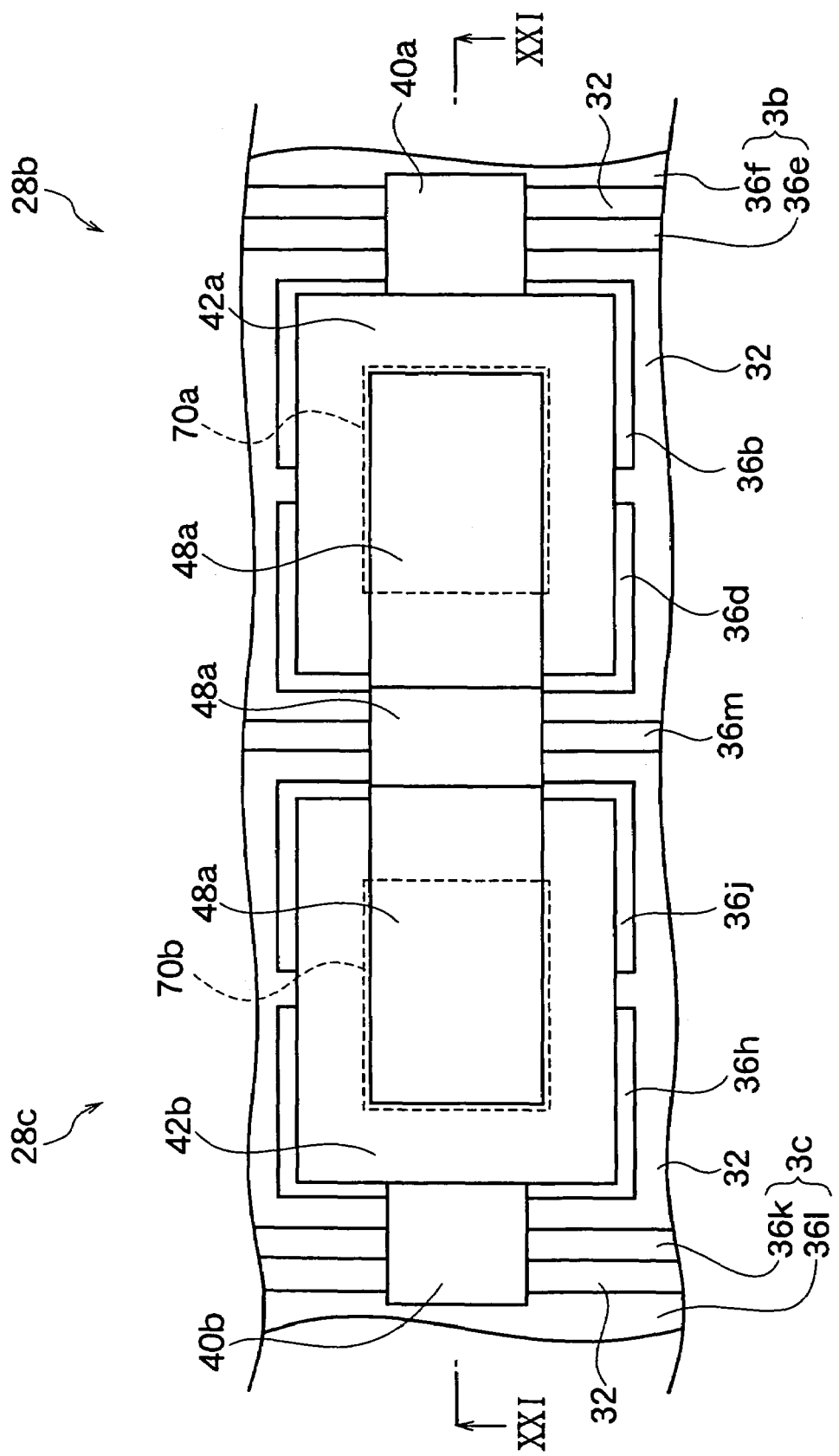
FIG. 20 is a plan view showing an example FBAR according to other embodiments of the present invention.

As shown in FIGS. 20 and 21, a first FBAR 28b is supported by first and second ridges 36a and 36b, third and fourth ridges 36c and 36d, fifth and sixth ridges 36e and 36f, and a seventh ridge 36m. The first and second ridges 36a and 36b are associated with a first insulator pattern 1b, the third and fourth ridges 36c and 36d are associated with a second insulator pattern 2b, the fifth and sixth ridges 36e and 36f are associated with a third insulator pattern 3*b*, and the seventh ridge 36*m* is associated with a fourth insulator pattern 4*b*, all of which are provided on an underlying layer 32, which is provided on a substrate 30. A second FBAR 28*c* is supported by first and second ridges 36*g* and 36*h*, third and fourth ridges 36*i* and 36*j*, fifth and sixth ridges 36*k* and 36*l*, and the seventh ridge 36*m*. The first and second ridges 36*g* and 36*h* are associated with a first insulator pattern 1*c*, the third and fourth ridges 36*i* and 36*j* are associated with a second insulator pattern 2*c*, the fifth and sixth ridges 36*k* and 36*l* are associated with a third insulator pattern 3*c*, and the seventh ridge 36*m* is associated with the fourth insulator pattern 4*b*, all of which are provided on an underlying layer 32, which is provided on a substrate 30.

The first FBAR 28*b* provides a bottom conductive layer 40*a*, a piezoelectric film 42*a* and a top conductive layer 48*a*. The second FBAR 28*c* provides a bottom conductive layer 40*b*, a piezoelectric film 42*b*, and the top conductive layer 48*a*. The first and second FBARs 28*b* and 28*c* are connected in series by the top conductive layer 48*a*.

For instance, the high frequency signal input to the bottom conductive layer 40*a* of the first FBAR 28*b* is transmitted to the top conductive layer 48*a* through a resonator 70*a*, which is provided on a first cavity 50*a* of the first FBAR 28*b*. The high frequency signal transmitted to the top conductive layer 48*a* is transmitted to the bottom conductive layer 40*b* of the second FBAR 28*c*, through a resonator 70*b*, which is provided on a first cavity 50*b* of the second FBAR 28*c*. The wiring of the seventh ridge 36*m* of the top conductive layer 48*a* interconnecting the first and second FBARs 28*b* and 28*c* is shortened in order to reduce the effects of wiring resistance and parasitic capacitance.

In the first and second FBARs 28*b* and 28*c* according to the other embodiments, the bottom conductive layers 40*a* and 40*b*, and the top conductive layer 48*a* are all disposed above the first and second ridges 36*g* and 36*h*, the fourth ridge 36*j*, the fifth and sixth ridges 36*k* and 36*l*, the seventh ridge 36*m*, and a second cavity 52. Therefore, it is possible to reduce the parasitic capacitance between the bottom conductive layers 40*a* and 40*b*, the top conductive layer 48*a* and the substrate 30. As a result, it is possible to suppress deterioration of high frequency properties of the first and second FBARs as in the other embodiments. Also, deterioration of the resonance of the first and second FBARs 28*b* and 28*c* can be reduced if the periods of the first through seventh ridges 36*a* through 36*m* are made to correspond to the ¼ integral multiple of the piezoelectric film wavelength.

Also, in the first and second embodiments, the widths of the first through eighth ridges 34*a* through 34*h*, 35*a* through 35*h*, and the second cavity 52 are equal. The above ridges are associated with the first through fourth insulator patterns 1 through 4 and 1*a* through 4*a*. However, the widths of the first through eighth ridges 34*a* through 34*h*, 35*a* through 35*h*, and the second cavity 52 are not restricted to equal widths. For instance, if the widths of the first through eighth ridges 34*a* through 34*h*, 35*a* through 35*h* are narrowed, parasitic capacitance can be reduced even further, achieving excellent high frequency properties.

Various modifications will become possible for those skilled in the art after receiving the teachings of the present disclosure without departing from the scope thereof.

What is claimed is:

1. A film bulk acoustic resonator, comprising:
   a first insulator pattern;
   a second insulator pattern disposed apart from the first insulator pattern;
   a third insulator pattern disposed in an opposite direction to the second insulator pattern in relation to the first insulating pattern and apart from the first insulating pattern;
   a fourth insulator pattern disposed in an opposite direction to the first insulator pattern in relation to the second insulating pattern and apart from the second insulator pattern;
   a bottom conductive layer disposed above the first and third insulator patterns, spreading from a region between the first and second insulator patterns to the third insulator pattern;
   a piezoelectric film on the bottom conductive layer, disposed above the region between the first and second insulating patterns; and
   a top conductive layer facing the bottom conductive layer to sandwich the piezoelectric film, the top conductive layer spreading from the region between the first and second insulator patterns to the fourth insulator pattern.

2. The film bulk acoustic resonator of claim 1, wherein at least one of the first through fourth insulator patterns includes a plurality of ridges spaced apart from each other.

3. The film bulk acoustic resonator of claim 2, wherein the ridges are disposed periodically outside of a resonator defined as an overlapping area of the bottom and top conductive layers, and a section of the piezoelectric film sandwiched between the bottom and top conductive layers.

4. The film bulk acoustic resonator of claim 3, wherein the ridges are disposed outside of the resonator at a period of an integral multiple of a fourth of a wavelength of a sound wave propagating in the piezoelectric film corresponding to a resonance frequency of the resonator.

5. The film bulk acoustic resonator of claim 3, wherein a width of the ridges in a direction of a period of the ridges is less than a half of the period.

6. The film bulk acoustic resonator of claim 1, wherein the first and second insulator patterns are in a mirror symmetry.

7. The film bulk acoustic resonator of claim 1, wherein the third and fourth insulator patterns are in a mirror symmetry.

8. The film bulk acoustic resonator of claim 2, wherein the ridges include spin on glass material.

9. The film bulk acoustic resonator of claim 1, wherein the bottom conductive layer includes at least one of a refectory metal and a refractory metal compound.

10. The film bulk acoustic resonator of claim 1, wherein the piezoelectric film includes aluminum nitride.

* * * * *